(12) United States Patent
Yeh et al.

(10) Patent No.: US 10,868,131 B2
(45) Date of Patent: Dec. 15, 2020

(54) GASEOUS SPACER AND METHODS OF FORMING SAME

(71) Applicant: Taiwan Semiconductor Manufacturing Company, Ltd., Hsinchu (TW)

(72) Inventors: Hsin-Hao Yeh, Taipei (TW); Ching Yu Huang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/601,111

(22) Filed: Oct. 14, 2019

(65) Prior Publication Data

US 2020/0044042 A1 Feb. 6, 2020

Related U.S. Application Data

(63) Continuation of application No. 16/010,061, filed on Jun. 15, 2018, now Pat. No. 10,510,861.

(51) Int. Cl.
*H01L 29/51* (2006.01)
*H01L 29/78* (2006.01)
*H01L 29/66* (2006.01)

(52) U.S. Cl.
CPC ........ *H01L 29/515* (2013.01); *H01L 29/6656* (2013.01); *H01L 29/66545* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 5,915,182 A * | 6/1999 | Wu | H01L 21/2652 438/299 |
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2008/0254579 A1 * | 10/2008 | Chi | H01L 29/665 438/199 |
| 2010/0313932 A1 * | 12/2010 | Kroll | H01L 31/0236 136/244 |
| 2013/0307140 A1 | 11/2013 | Huang et al. | |
| 2014/0024192 A1 * | 1/2014 | Kim | H01L 29/6653 438/296 |
| 2014/0282326 A1 | 9/2014 | Chen et al. | |
| 2015/0255571 A1 * | 9/2015 | Xu | H01L 29/66545 257/288 |
| 2018/0006128 A1 | 1/2018 | Cheng et al. | |
| 2019/0067120 A1 * | 2/2019 | Ching | H01L 29/66545 |

* cited by examiner

*Primary Examiner* — Fernando L Toledo
*Assistant Examiner* — Valerie N Newton
(74) *Attorney, Agent, or Firm* — Slater Matsil, LLP

(57) ABSTRACT

A method for forming a gaseous spacer in a semiconductor device and a semiconductor device including the gaseous spacer are disclosed. In an embodiment, the method may include forming a gate stack over a substrate, depositing a first gate spacer on sidewalls of the gate stack, epitaxially growing source/drain regions on opposite sides of the gate stack, and depositing a second gate spacer over the first gate spacer to form a gaseous spacer below the second gate spacer. The gaseous spacer may be disposed laterally between the source/drain regions and the gate stack.

20 Claims, 26 Drawing Sheets

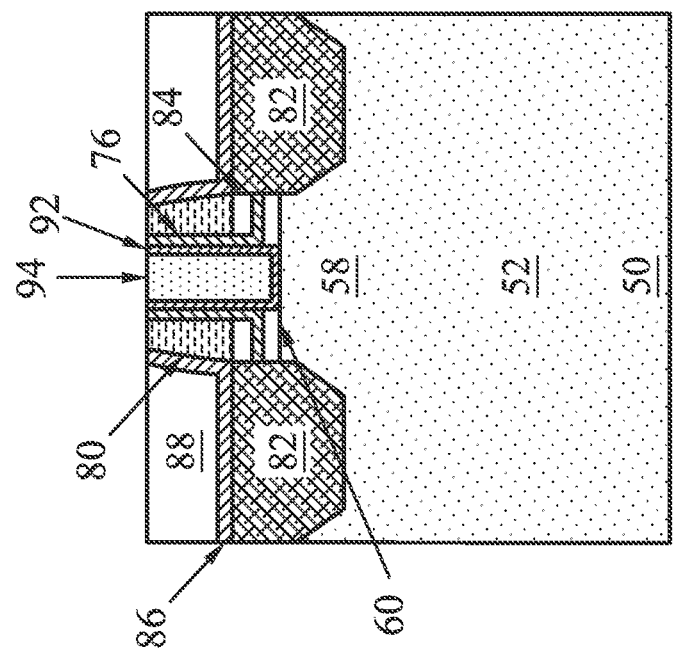
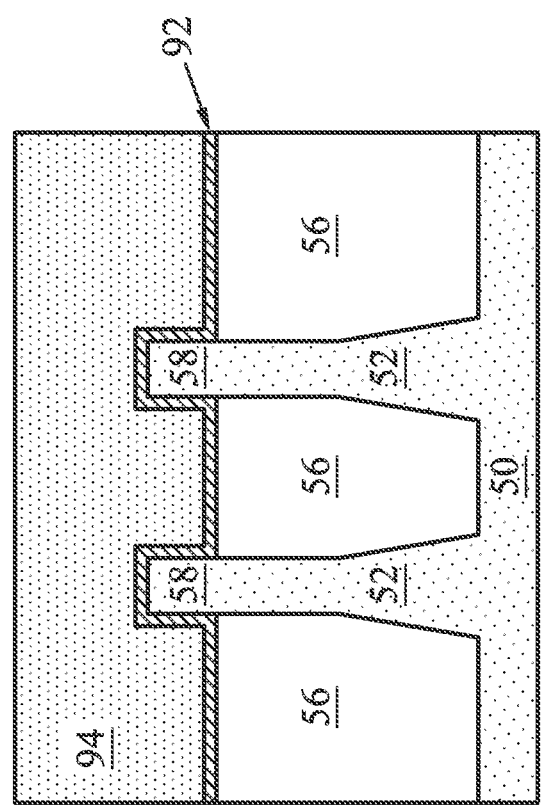
Figure 17B
Figure 17A

GASEOUS SPACER AND METHODS OF FORMING SAME

CROSS-REFERENCE TO RELATED APPLICATIONS

This application is a continuation of U.S. patent application Ser. No. 16/010,061 filed on Jun. 15, 2018, entitled "Gaseous Spacer and Methods of Forming Same," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-7, 8A-8C, 9A-9C, 10A-10C, 11A-11C, 12A-12C, 13A-13C, 14A-14C, 15A, 15B, 16A, 16B, 17A, 17B, 18A, 18B, 19A, and 19B are cross-sectional views of intermediate stages in the manufacturing of FinFETs, in accordance with some embodiments.

DETAILED DESCRIPTION

Figure 1:
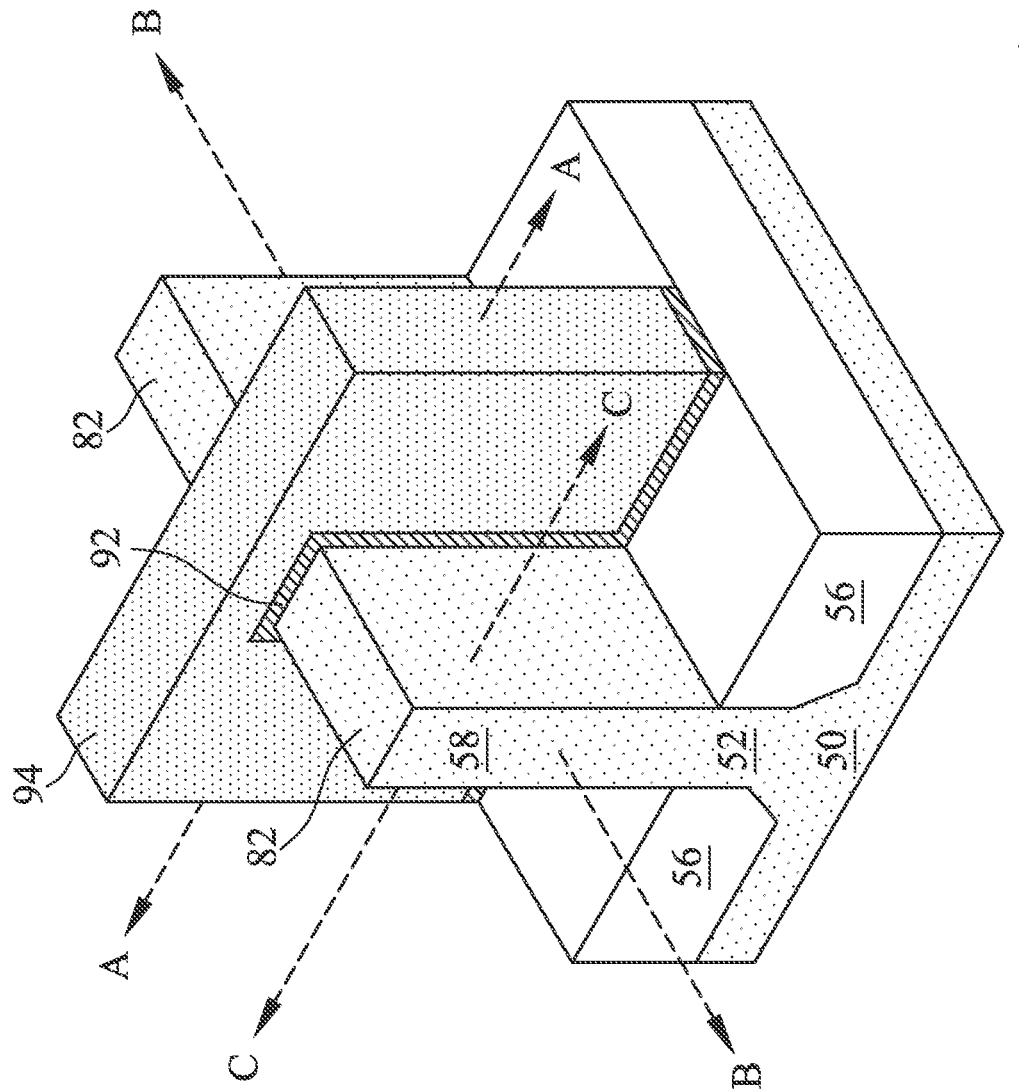
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a FinFET in a three-dimensional view for reference, in accordance with some embodiments. The FinFET comprises a fin 58 on a substrate 50 (e.g., a semiconductor substrate). Isolation regions 56 are disposed in the substrate 50, and the fin 58 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. A gate dielectric layer 92 is along sidewalls of the fin 58 and over a top surface of the fin 58, and a gate electrode 94 is over the gate dielectric layer 92. Source/drain regions 82 are disposed in opposite sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is perpendicular to cross-section A-A and is along a longitudinal axis of the fin 58 and in a direction of, for example, a current flow between the source/drain regions 82 of the FinFET. Cross-section C-C is parallel to cross-section A-A and extends through one of the source/drain regions 82 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 19B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. In FIGS. 8A through 19B, figures ending with an "A" designation are illustrated along reference cross-section A-A illustrated in FIG. 1, figures ending with a "B" designation are illustrated along reference cross-section B-B illustrated in FIG. 1, and figures ending with a "C" designation are illustrated along reference cross-section C-C illustrated in FIG. 1.

Figure 2:
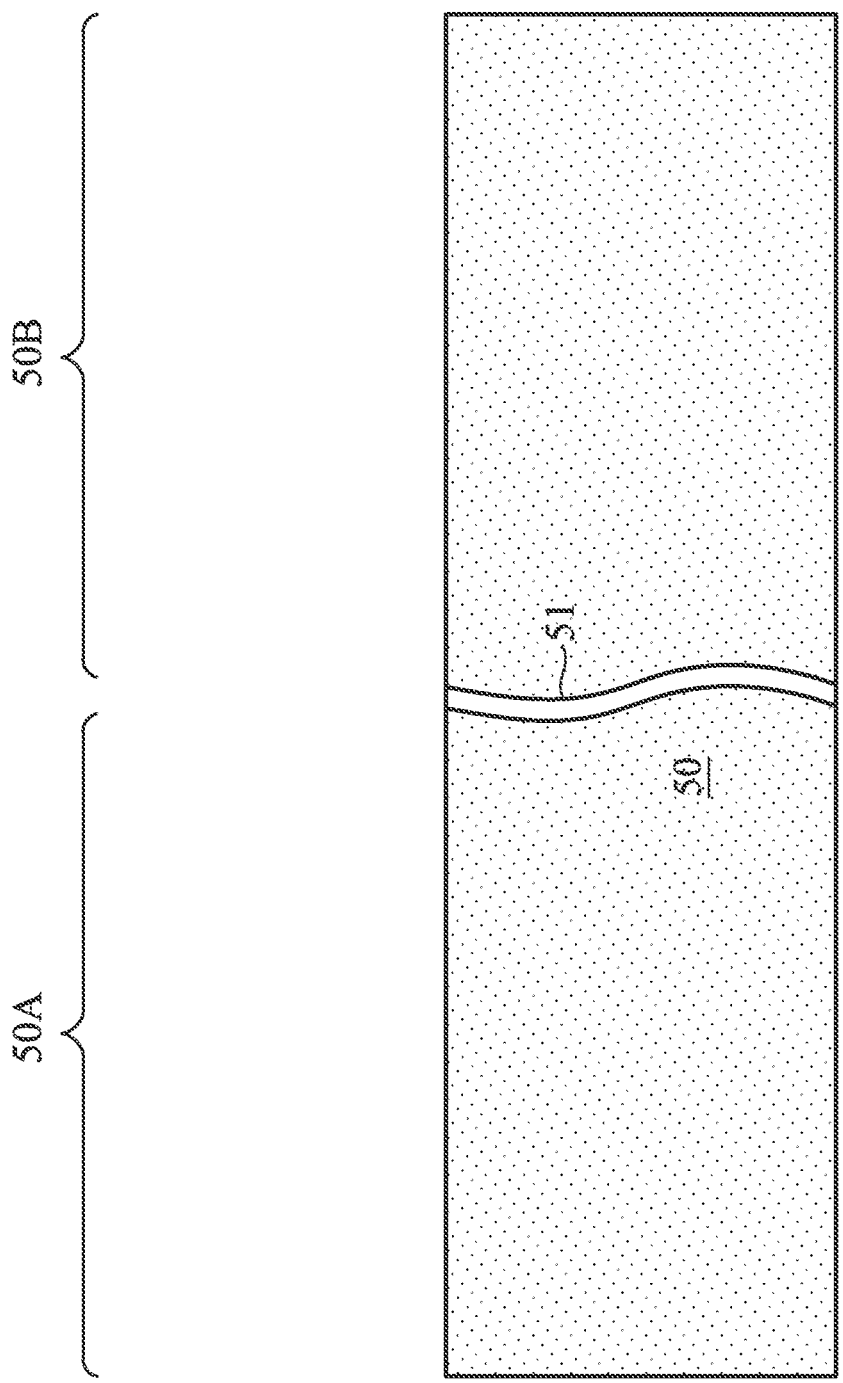

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate which is typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50A and a region 50B. The region 50A can be for forming n-type devices, such as NMOS transistors, e.g., n-type FinFETs. The region 50B can be for forming p-type devices, such as PMOS transistors, e.g., p-type FinFETs. The region 50A may be physically separated from the region 50B (as illustrated by divider 51), and any number of device features (e.g., other active devices, doped regions, isolation structures, etc.) may be disposed between the region 50A and the region 50B. In some embodiments, both the region 50A and the region 50B are used to form the same type of devices, such as both regions being for n-type devices or p-type devices.

Figure 3:
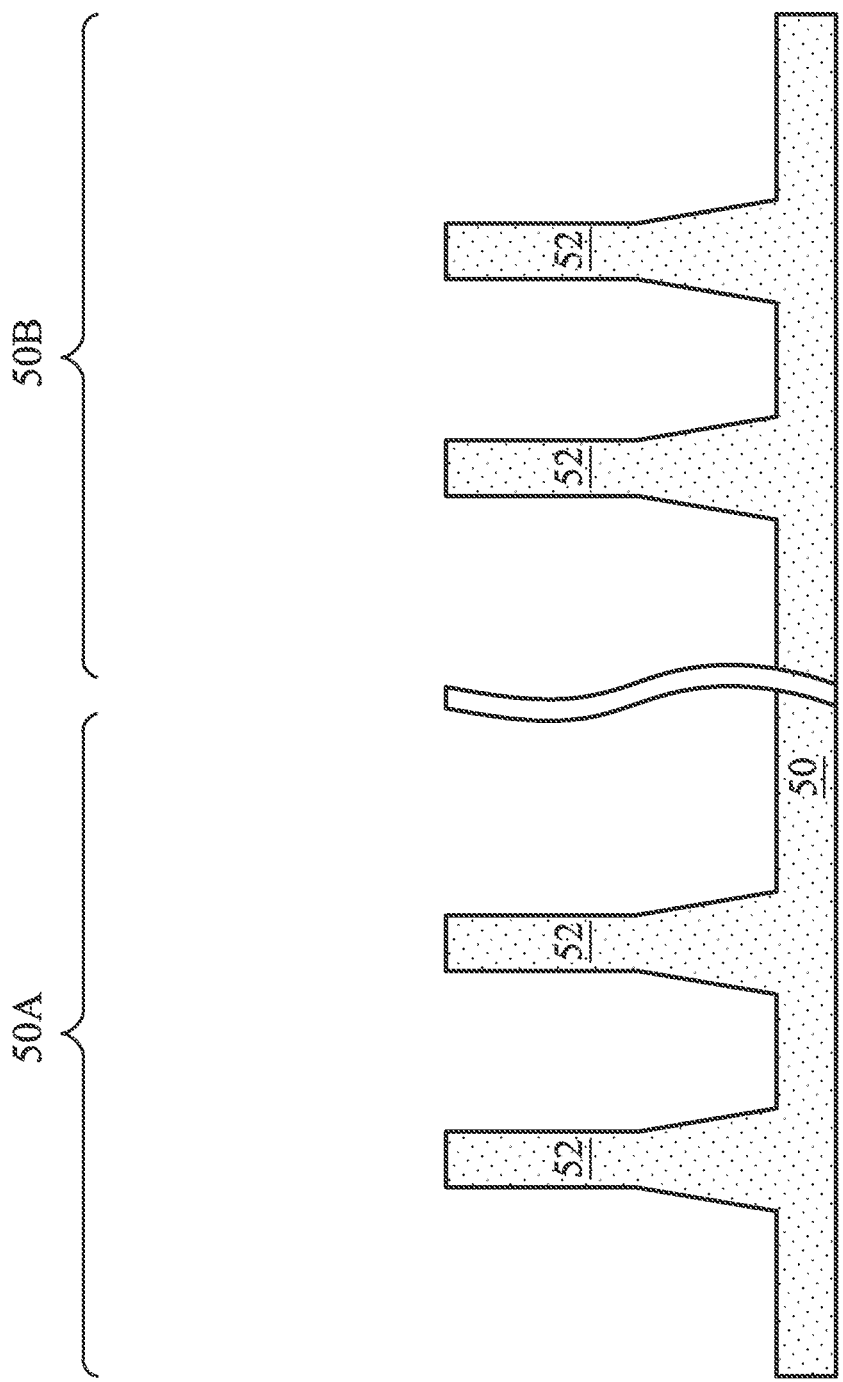

In FIG. 3, fins 52 are formed in the substrate 50. The fins 52 are semiconductor strips. In some embodiments, the fins 52 may be formed in the substrate 50 by etching trenches in the substrate 50. The etching may be one or more of any acceptable etch process, such as a reactive ion etch (RIE), neutral beam etch (NBE), the like, or a combination thereof. The etching may be anisotropic. Please note, although the fins 52 are illustrated as having linear edges, the fins 52 may be rounded or have any other suitable shape.

Figure 4:
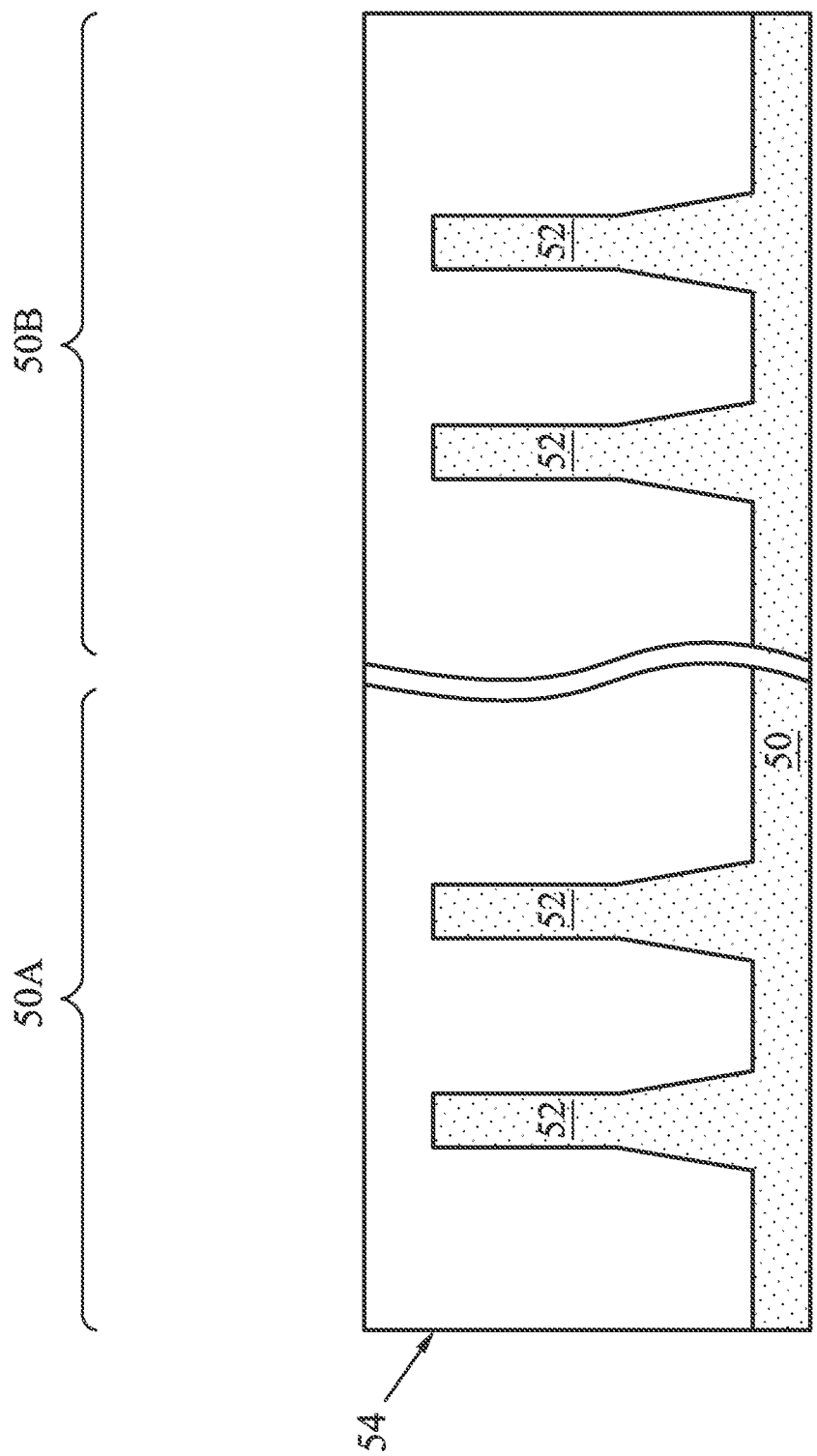

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system, followed by a post-deposition cure to convert the material to another material, such as an oxide), the like, or a combination thereof. Other insulation materials formed by any acceptable process may be used. In the illustrated embodiment, the insulation material 54 is silicon oxide formed by an FCVD process. An anneal process may be performed once the insulation material is formed. In an embodiment, the insulation material 54 is formed such that excess insulation material covers the fins 52.

Figure 5:
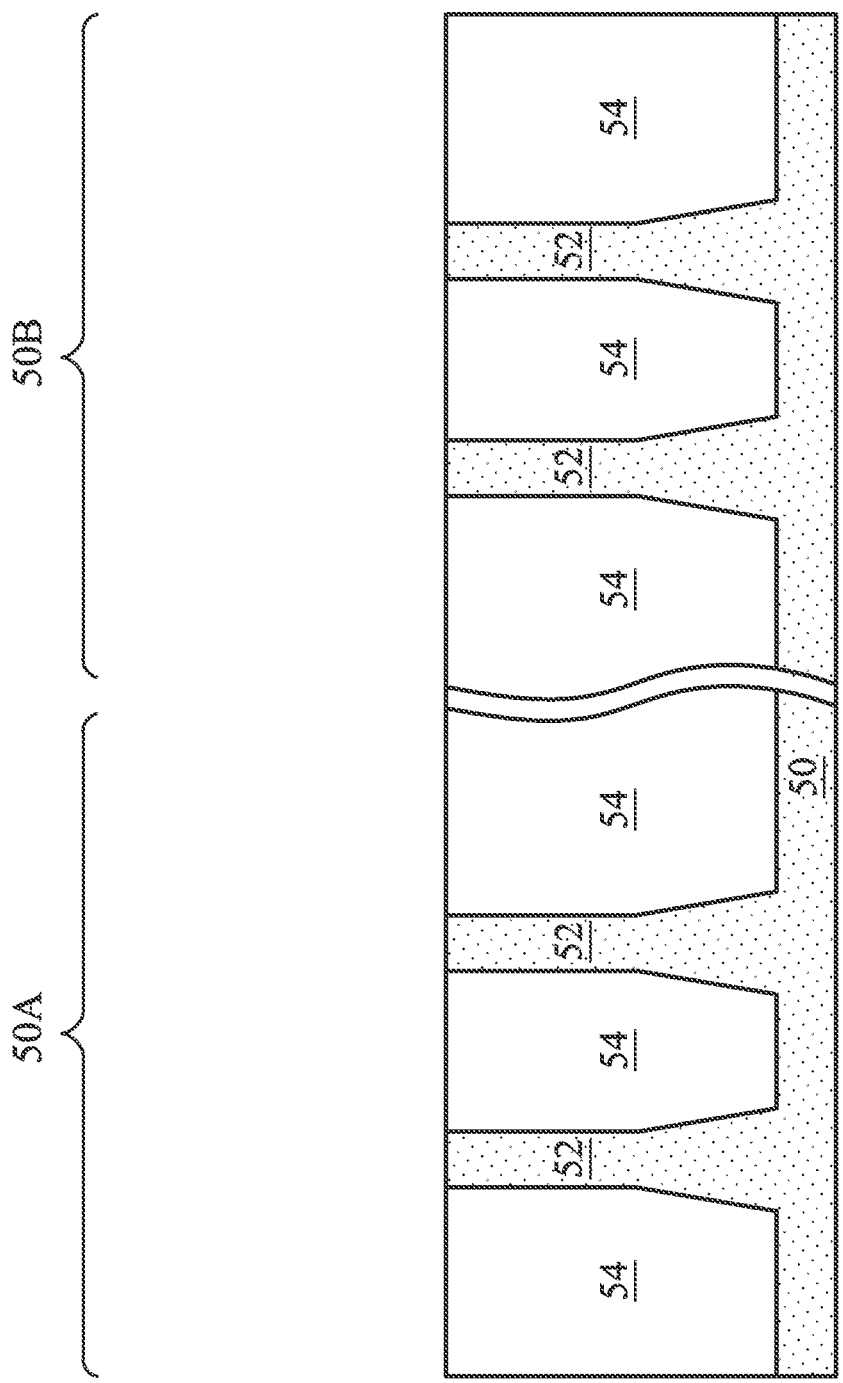

In FIG. 5, a planarization process is applied to the insulation material 54. In some embodiments, the planarization process includes a chemical mechanical polish (CMP), an etch-back process, combinations thereof, or the like. The planarization process exposes the fins 52. Top surfaces of the fins 52 and the insulation material 54 are level after the planarization process is complete.

Figure 6:
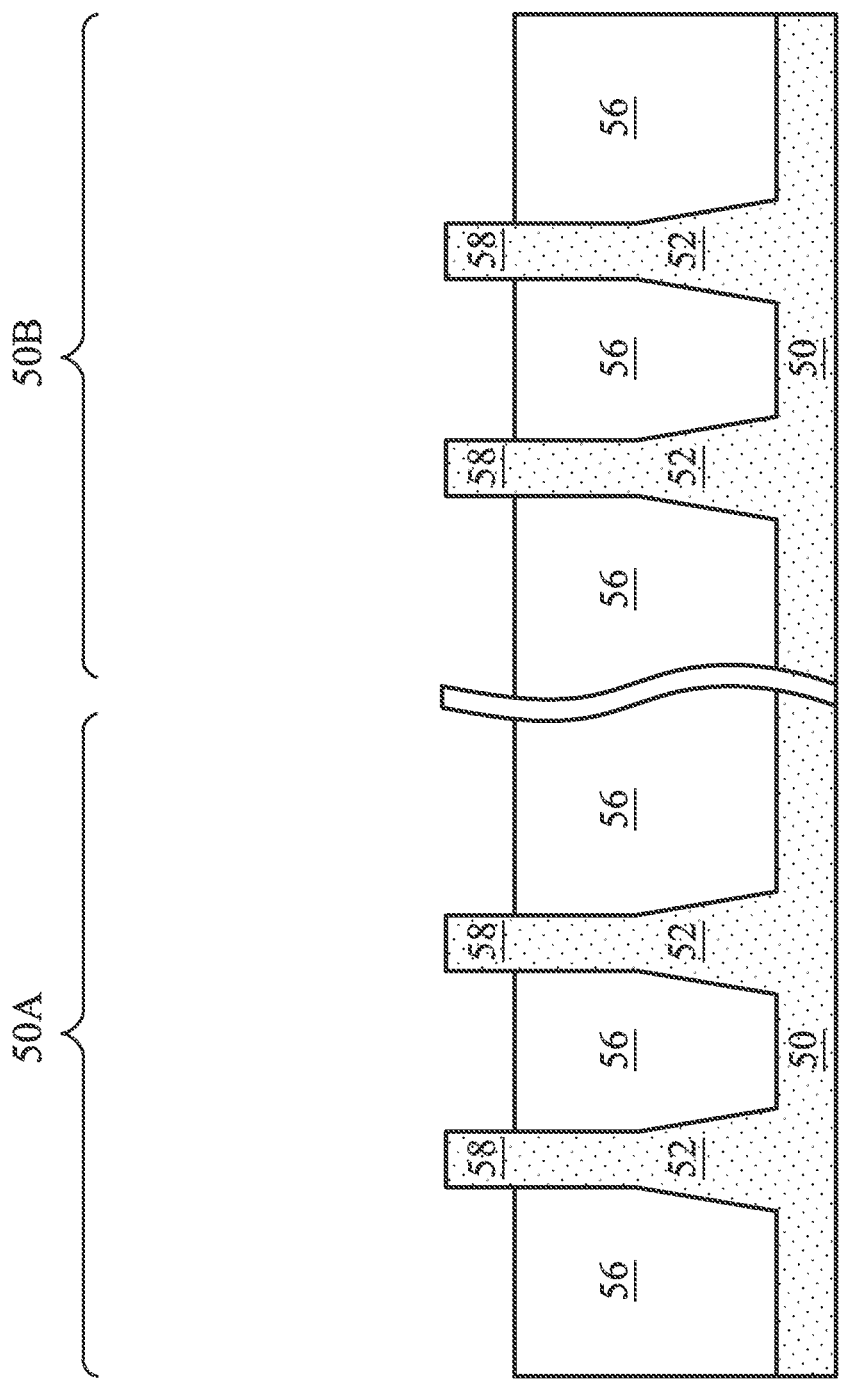

In FIG. 6, the insulation material 54 is recessed to form shallow trench isolation (STI) regions 56. The insulation material 54 is recessed such that fins 58 in the region 50A and in the region 50B protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by using an appropriate etch. The STI regions 56 may be recessed using an acceptable etching process, such as one that is selective to the material of the insulation material 54. For example, a chemical oxide removal using a CERTAS® etch, an Applied Materials SICONI tool, or dilute hydrofluoric (dHF) acid may be used.

A person having ordinary skill in the art will readily understand that the process described with respect to FIGS. 2 through 6 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form the fins 58. In some embodiments, heteroepitaxial structures can be used for the fins 52. For example, the fins 52 in FIG. 5 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the epitaxially grown materials may be in situ doped during growth. This may obviate prior and subsequent implantations, although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In additional embodiments, appropriate wells (not separately illustrated) may be formed in the fins 58, the fins 52, and/or the substrate 50. In some embodiments, a P well may be formed in the region 50A and an N well may be formed in the region 50B. In some embodiments, a P well or an N well may be formed in both the region 50A and the region 50B.

In embodiments in which different well types are formed, the different implant steps for the region 50A and the region 50B may be achieved using a photoresist or other masks (not separately illustrated). For example, a photoresist may be formed over the fins 58 and the STI regions 56 in the region 50A and the region 50B. The photoresist is patterned to expose the region 50B of the substrate 50, such as a PMOS region. The photoresist can be formed by using a spin-on technique and can be patterned using acceptable photolithography techniques. Once the photoresist is patterned, an n-type impurity implant is performed in the region 50B, and the photoresist may act as a mask to substantially prevent n-type impurities from being implanted into the region 50A, such as an NMOS region. The n-type impurities may be phosphorus, arsenic, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50B, a second photoresist is formed over the fins 58 and the STI regions 56 in the region 50A and the region 50B. The photoresist is patterned to expose the region 50A of the substrate 50, such as the NMOS region. The photoresist can be formed by using a spin-on technique and can be patterned using acceptable photolithography techniques. Once the photoresist is patterned, a p-type impurity implant may be performed in the region 50A, and the photoresist may act as a mask to substantially prevent p-type impurities from being implanted into the region 50B, such as the PMOS region. The p-type impurities may be boron, $BF_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50A and the region 50B, an anneal may be performed to activate the p-type and/or n-type impurities that were implanted. In some embodiments, the grown materials of epitaxial fins may be in situ doped during growth, which may obviate the implantations. According to some embodiments, in situ and implantation doping may be used together.

Figure 7:
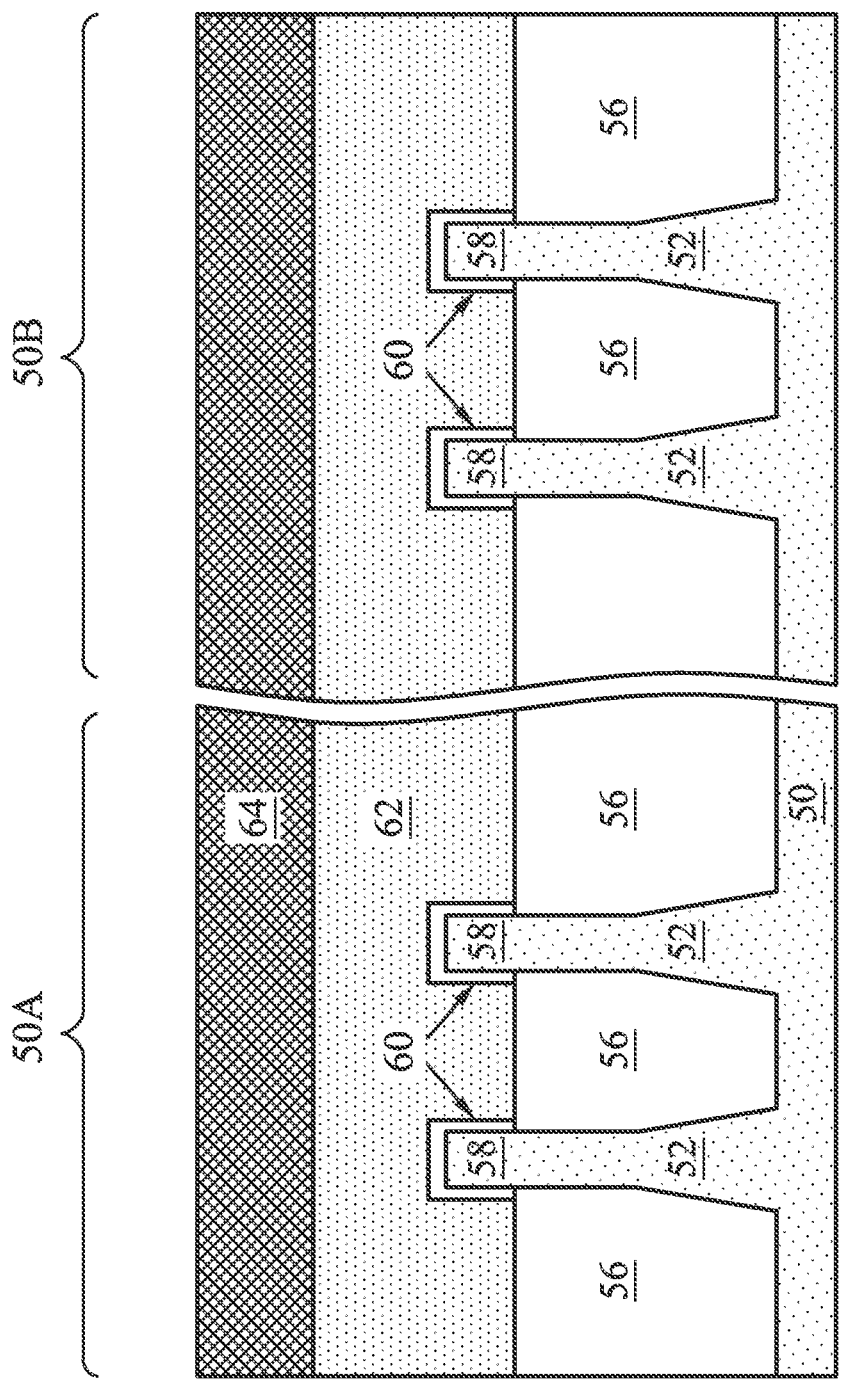

In FIG. 7, a dummy dielectric layer 60 is formed on the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), polycrystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50A and the region 50B. In some embodiments, separate dummy gate layers 62 may be formed in the region 50A and the region 50B, and separate mask layers 64 may be formed in the region 50A and the region 50B. For example, in some embodiments, the mask layer 64 may comprise a first mask layer comprising silicon oxide ($SiO_2$) formed over the dummy gate layer 62 and a second mask layer comprising silicon nitride (SiN) formed over the first mask layer.

FIGS. 8A through 19B illustrate various additional steps in the manufacturing of embodiment devices. FIGS. 8A through 19B illustrate features in either of the region 50A and the region 50B. For example, the structures illustrated in FIGS. 8A through 19B may be applicable to both the region 50A and the region 50B.

Figure 8B:
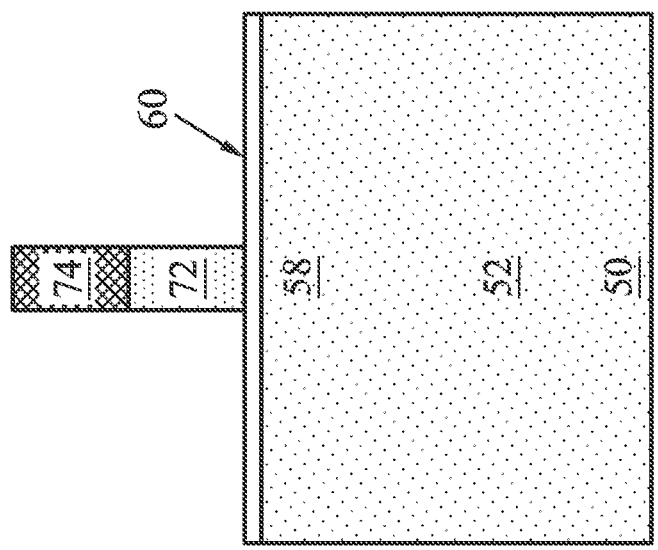
Figure 8A:
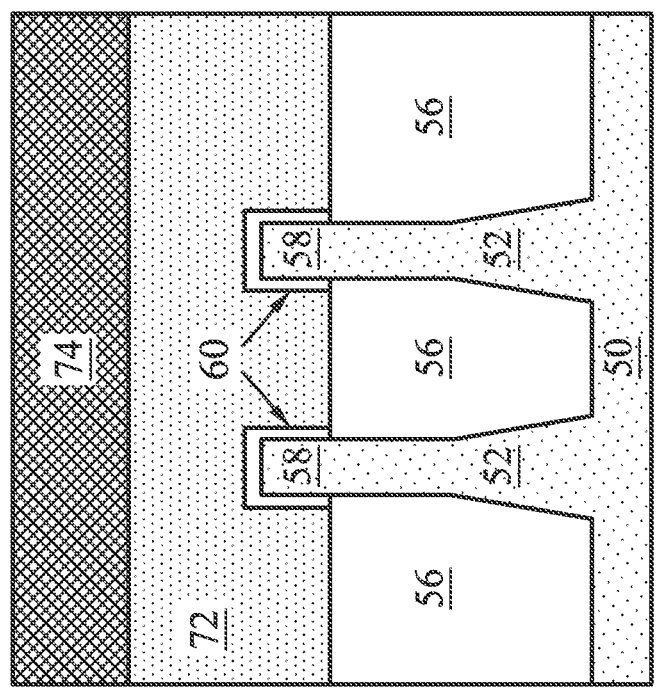
Figure 8C:
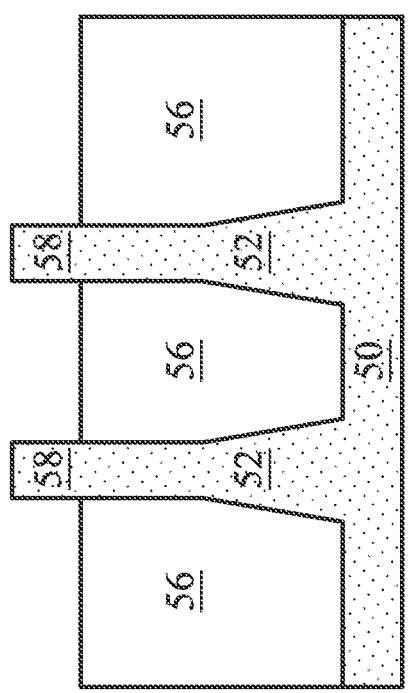

In FIGS. 8A-8C, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gate electrodes 72. The dummy gate electrodes 72 cover respective channel regions of the fins 58. The pattern of the masks 74 may be used to physically separate each of the dummy gate electrodes 72 from adjacent dummy gate electrodes. The dummy gate electrodes 72 may also have a lengthwise direction substantially perpendicular to the lengthwise direction of respective epitaxial fins 52/58.

As illustrated in FIGS. 8A and 8B, the dummy dielectric layer 60, the dummy gate electrodes 72, and the masks 74 are disposed over the fins 58 in the reference cross-section A-A and the reference cross-section B-B. However, as illustrated in FIG. 8C, the dummy dielectric layer 60, the dummy gate electrodes 72, and the masks 74 are etched from above the fins 58 in the reference cross-section C-C such that the fins 58 are free from the dummy dielectric layer 60, the dummy gate electrodes 72, and the masks 74 in this cross-section.

After the formation of the dummy gate electrodes 72 and the masks 74, implants for lightly doped source/drain (LDD) regions (not separately illustrated) may be performed. In the embodiments with different device types, similar to the implants discussed above in FIG. 6, a mask, such as a photoresist, may be formed over the region 50A, while exposing the region 50B, and appropriate type (e.g., n-type or p-type) impurities may be implanted into the exposed fins 58 in the region 50B. The mask may then be removed. Subsequently, a mask, such as a photoresist, may be formed over the region 50B while exposing the region 50A, and appropriate type impurities may be implanted into the exposed fins 58 in the region 50A. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
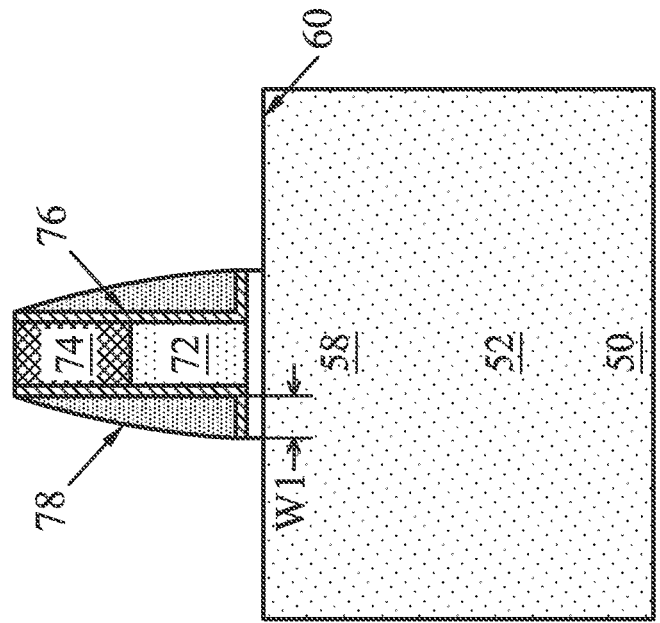
Figure 9A:
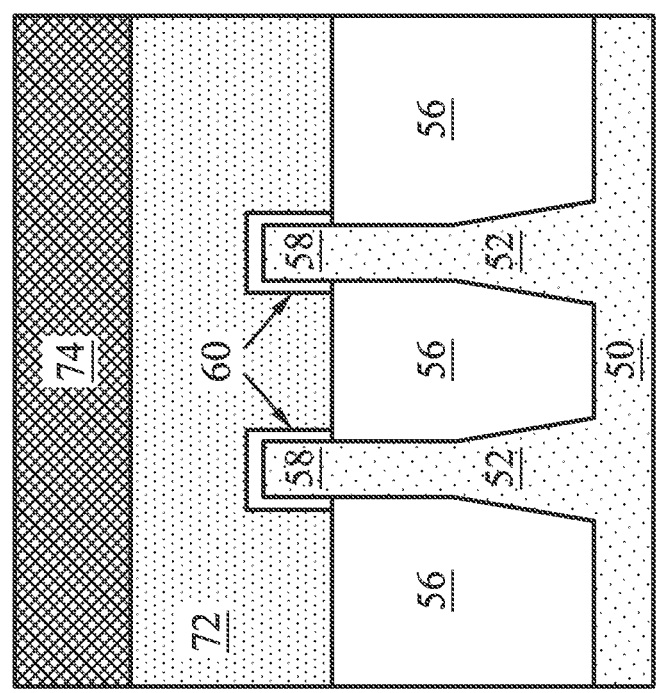
Figure 9C:
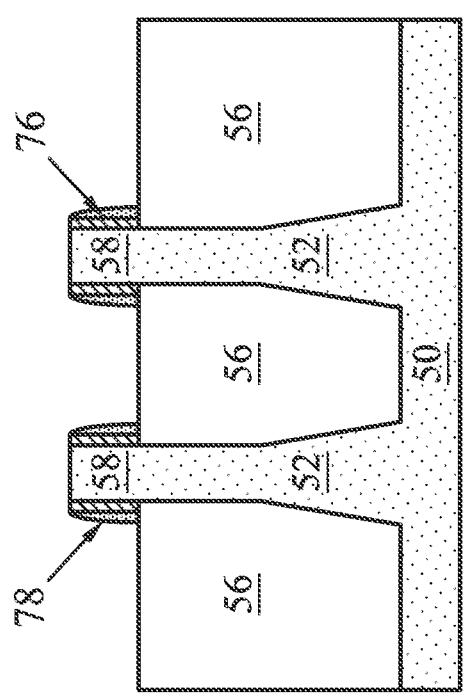

In FIGS. 9A-9C, a first gate spacer layer and a dummy gate spacer layer (not separately illustrated) are formed along sidewalls of the dummy gate electrodes 72, the masks 74, and the fins 58 and over top surfaces of the dummy dielectric layer 60 and the fins 58 and then etched to form first gate spacers 76 and dummy gate spacers 78. As will be discussed in detail below, the dummy gate spacers 78 are subsequently removed and replaced and are therefore referred to as dummy gate spacers. Any suitable methods of forming the first gate spacer layer may be used. In some embodiments, a deposition (such as CVD, ALD, or the like) or thermal oxidation may be used form the first gate spacer layer. In some embodiments, the first gate spacer layer may include one or more layers of, for example, silicon nitride (SiN), silicon-oxygen-nitride (SiON), silicon-carbon-nitride (SiCN), silicon-oxygen-carbon-nitride (SiOCN), a combination thereof, or the like. In some embodiments, the first gate spacer layer may comprise one or more layers of SiOCN (also referred to as KN1). In some embodiments, the first gate spacer layer has a thickness of between about 2 nm and about 10 nm, such as about 4 nm.

In some embodiments, the dummy gate spacer layer may be formed over the first gate spacer layer using similar processes, but different materials than the first gate spacer layer. In an embodiment, the dummy gate spacer layer may comprise one or more layers of SiN. In some embodiments, the dummy gate spacer layer may comprise one or more layers of silicon-rich SiN. The dummy gate spacer layer may have a refractive index (RI) of between about 1.6 and about 2.5, such as about 1.8. In some embodiments, the dummy gate spacer layer have a thickness of between about 4 nm and about 10 nm, such as about 6 nm or about 7.5 nm.

In embodiments in which the dummy gate spacer layer comprises silicon-rich SiN, the dummy gate spacer layer may be deposited using a process temperature of between about 550° C. and about 800° C., such as about 580° C. The silicon-rich SiN is deposited by flowing a silicon precursor and ammonia ($NH_3$). The silicon precursor pressure is between about 1 torr and about 4 torr, such as about 2 torr.

The silicon precursor flowrate and the NH$_3$ flowrate are between about 2 standard liters per minute (slm) and about 6 slm, or between about 2 slm and about 20 slm, such as about 15 slm.

The dummy gate spacer layer may be formed of any material having a high etch selectivity rate as compared with the first gate spacer layer. As such, as will be discussed in more detail below, the dummy gate spacers 78 formed from the dummy gate spacer layer may be selectively removed without removing the first gate spacers 76 formed from the first gate spacer layer. In an embodiment in which the first gate spacer layer comprises KN1, which has a good etch resistance to phosphoric acid (H$_3$PO$_4$), the dummy gate spacer layer may have a high H$_3$PO$_4$ etch rate at 160° C. For example, the dummy gate spacer layer may have an H$_3$PO$_4$ etch rate of between about 100 Å/min and about 170 Å/min, such as about 150 Å/min, at 160° C. Accordingly, the dummy gate spacers 78 may be removed by an H$_3$PO$_4$ wet etch without removing the underlying first gate spacers 76.

As illustrated in FIGS. 9B and 9C, the first gate spacer layer and the dummy gate spacer layer may be anisotropically etched to form the first gate spacers 76 and the dummy gate spacers 78. Following the anisotropic etch, the dummy gate spacers 78 may have a maximum width W1 of between about 2 nm and about 7 nm, such as about 4 nm.

As illustrated in FIG. 9B, portions of the dummy dielectric layer 60 which are not underlying the dummy gate electrode 72, the first gate spacers 76, or the dummy gate spacer 78 may be removed. For example, hydroflouric acid (HF) may be used in a wet etch process to remove portions of the dummy dielectric layer 60. The dummy gate spacers 78 may be formed of a material having a good etch resistance to HF such that the dummy gate spacers 78 remain intact following a wet etch of the dummy dielectric layer 60. For example, the dummy gate spacers 78 may have an etch rate of less than 5 Å/20 seconds for HF having a concentration of 100 parts de-ionized water (DI water):1 part HF.

Figure 10B:
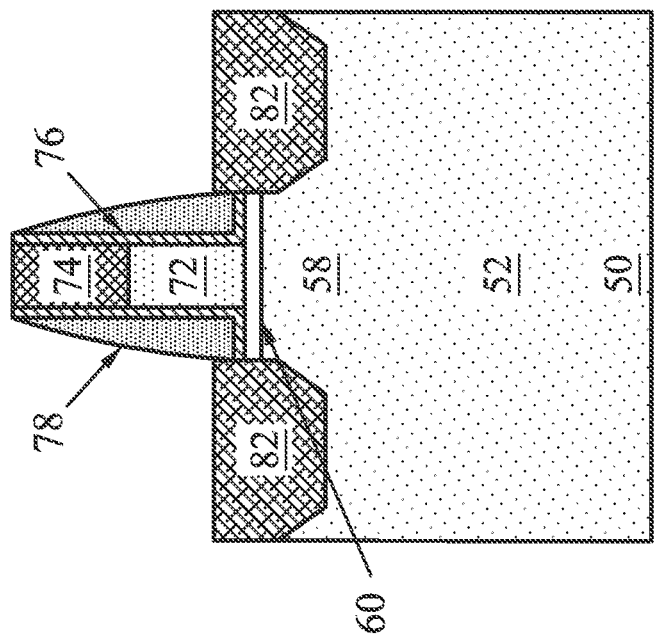
Figure 10A:
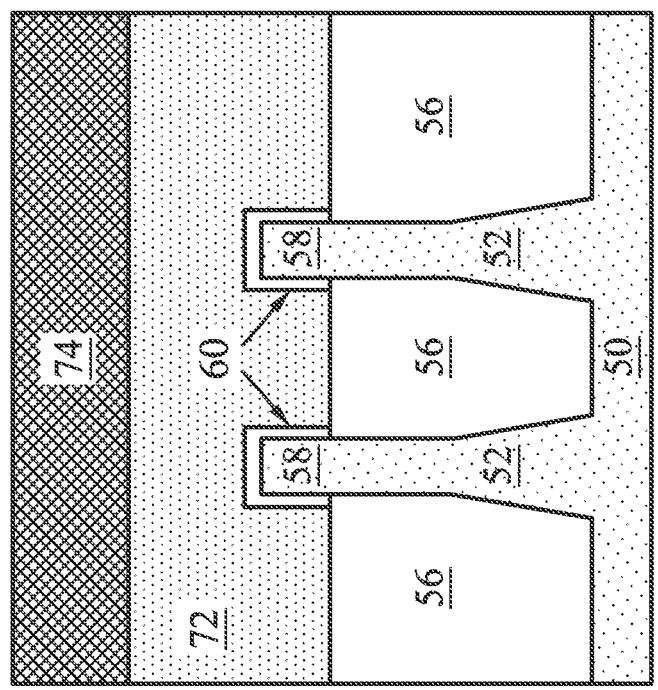
Figure 10C:
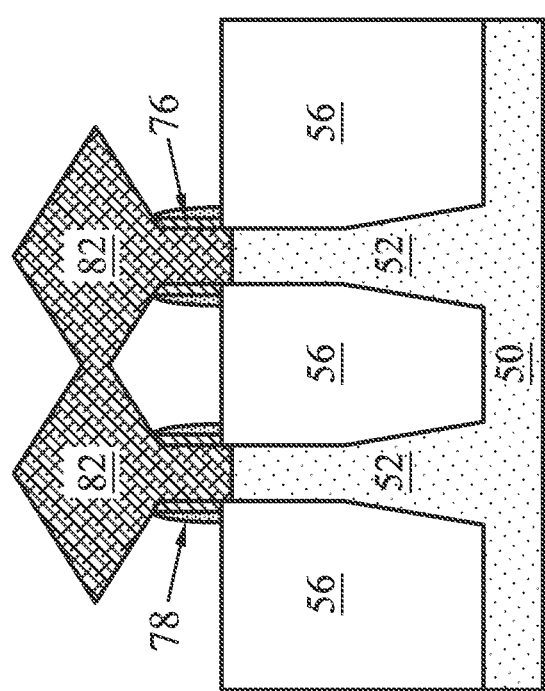

In FIGS. 10A-10C, epitaxial source/drain regions 82 are formed in the fins 58. The epitaxial source/drain regions 82 are formed in the fins 58 such that each dummy gate electrode 72 is disposed between respective neighboring pairs of the epitaxial source/drain regions 82. In some embodiments, the epitaxial source/drain regions 82 may extend into the fins 52. In some embodiments, the first gate spacers 76 and the dummy gate spacers 78 are used to separate the epitaxial source/drain regions 82 from the dummy gate electrodes 72 by an appropriate lateral distance so that the epitaxial source/drain regions 82 do not short out subsequently formed gates of the resulting FinFETs.

The epitaxial source/drain regions 82 in the region 50A (e.g., the NMOS region) may be formed by masking the region 50B (e.g., the PMOS region) and etching source/drain regions of the fins 58 in the region 50A to form recesses in the fins 58. Then, the epitaxial source/drain regions 82 in the region 50A are epitaxially grown in the recesses. The epitaxial source/drain regions 82 may include any acceptable material, such as appropriate materials for n-type FinFETs. For example, if the fin 58 is silicon, the epitaxial source/drain regions 82 in the region 50A may include silicon, SiC, SiCP, SiP, or the like. The epitaxial source/drain regions 82 in the region 50A may have surfaces that are raised from respective surfaces of the fins 58 and may include facets.

The epitaxial source/drain regions 82 in the region 50B (e.g., the PMOS region) may be formed by masking the region 50A (e.g., the NMOS region) and etching source/drain regions of the fins 58 in the region 50B to form recesses in the fins 58. Then, the epitaxial source/drain regions 82 in the region 50B are epitaxially grown in the recesses. The epitaxial source/drain regions 82 may include any acceptable material, such as appropriate materials for p-type FinFETs. For example, if the fin 58 is silicon, the epitaxial source/drain regions 82 in the region 50B may comprise SiGe, SiGeB, Ge, GeSn, or the like. The epitaxial source/drain regions 82 in the region 50B may also have surfaces that are raised from respective surfaces of the fins 58 and may include facets.

Various wet etching processes may be employed to remove the masks used to mask the regions 50A and 50B for the above-described epitaxial growth processes. In an embodiment, a high temperature sulfuric peroxide mixture (HTSPM) may be used to remove the masks. Accordingly, the dummy gate spacers 78 may have a good etch resistance for HTSPM such that the dummy gate spacers 78 are not removed when the masks are etched. For example, the dummy gate spacers 78 may have an etch rate of less than 10 Å/120 seconds for HTSPM.

The epitaxial source/drain regions 82 and/or the fins 58 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50A and the region 50B, upper surfaces of the epitaxial source/drain regions 82 may have facets which expand laterally outward beyond sidewalls of the fins 58. In some embodiments, these facets cause adjacent epitaxial source/drain regions 82 of a same FinFET to merge, as illustrated by FIG. 10C. In other embodiments, adjacent epitaxial source/drain regions 82 may remain separated after the epitaxial growth process is completed (not separately illustrated).

Figure 11B:
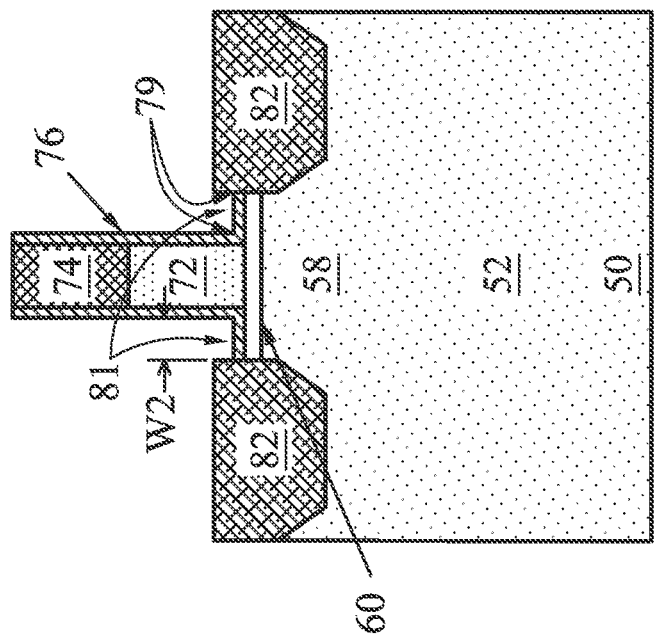
Figure 11A:
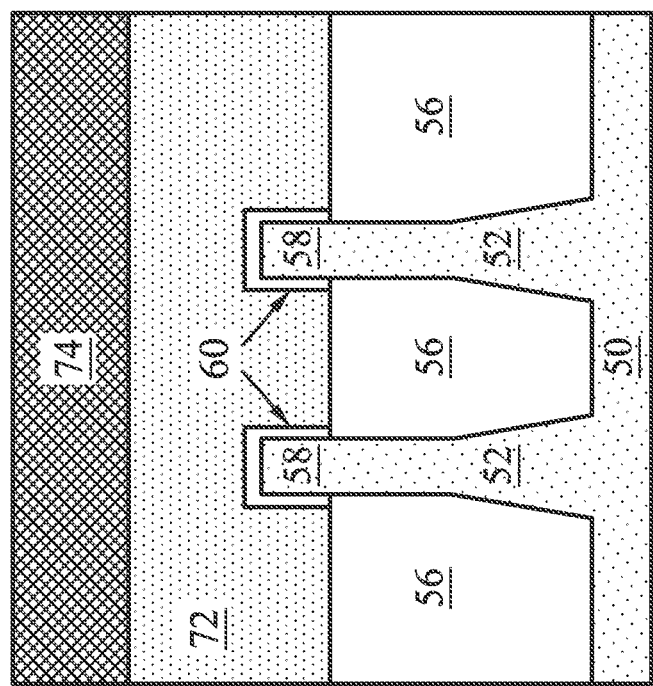
Figure 11C:
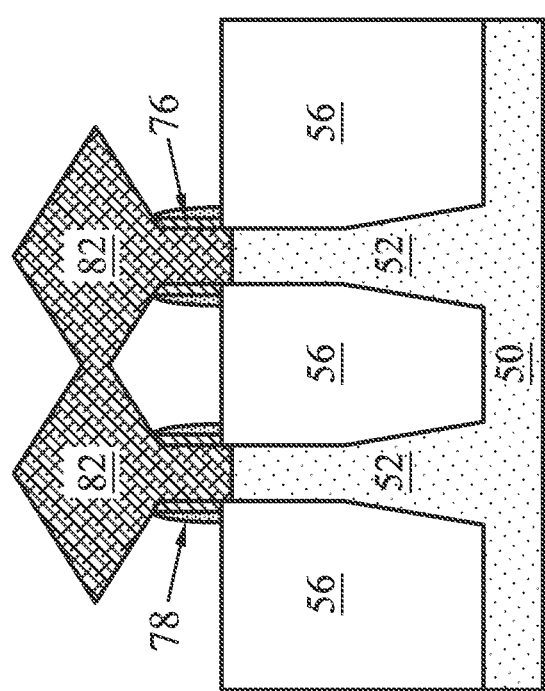

In FIGS. 11A-11C, the dummy gate spacers 78 are removed by etching. The dummy gate spacers 78 may be removed by a wet etch or a dry etch. In some embodiments, the dummy gate spacers 78 may be removed by a wet etch process using a high selectivity acid. For example, in an embodiment in which the first gate spacers 76 comprise KN1 and the dummy gate spacers 78 comprise Si-rich SiN, a wet etch using H$_3$PO$_4$ may be used to selectively remove the dummy gate spacers 78, without removing the first gate spacers 76.

As illustrated in FIGS. 11A and 11B, the wet etch may remove substantially all of the material of the dummy gate spacers 78, while leaving substantially all of the material of the first gate spacers 76 intact. As a result, as illustrated in FIG. 11B, recesses 81 may be formed laterally between the dummy gate electrode 72 and the epitaxial source/drain regions 82. More specifically, the recesses 81 may be formed between portions of the first gate spacers 76 formed along sidewalls of the dummy gates and the epitaxial source/drain regions 82. The recesses 81 may have a width W2 of between about 2 nm and about 7 nm, such as about 5 nm.

In some embodiments, the dummy gate spacers 78 may not be completely removed during the wet etch process. For example, as illustrated in FIG. 11C, a portion of the dummy gate spacers 78 may remain along sidewalls of the first gate spacers 76 in a region adjacent the epitaxial source/drain regions 82. Moreover, at least some of the material of the dummy gate spacers 78 may remain in corners 79, illustrated in FIG. 11B. In embodiments in which a portion of the dummy gate spacers 78 remains following the wet etch, the shape of the recesses 81 may be altered and the effective k value of gaseous spacers 84, as will be discussed in detail below, may be raised.

Figure 12B:
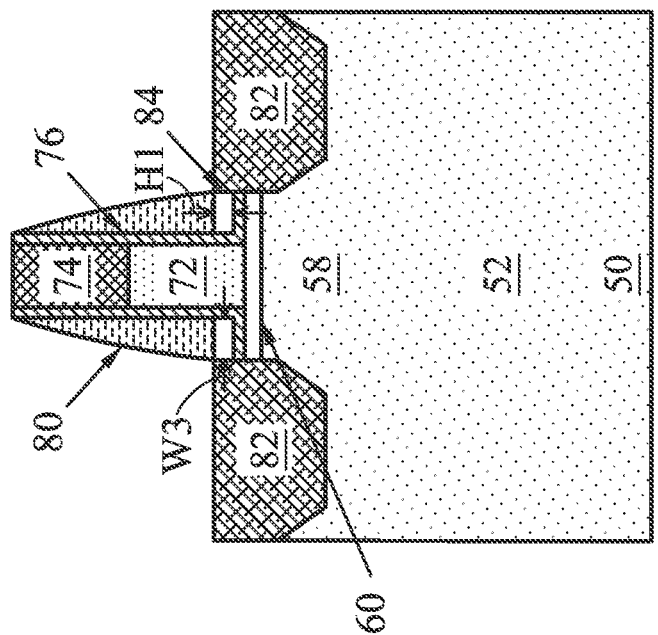
Figure 12A:
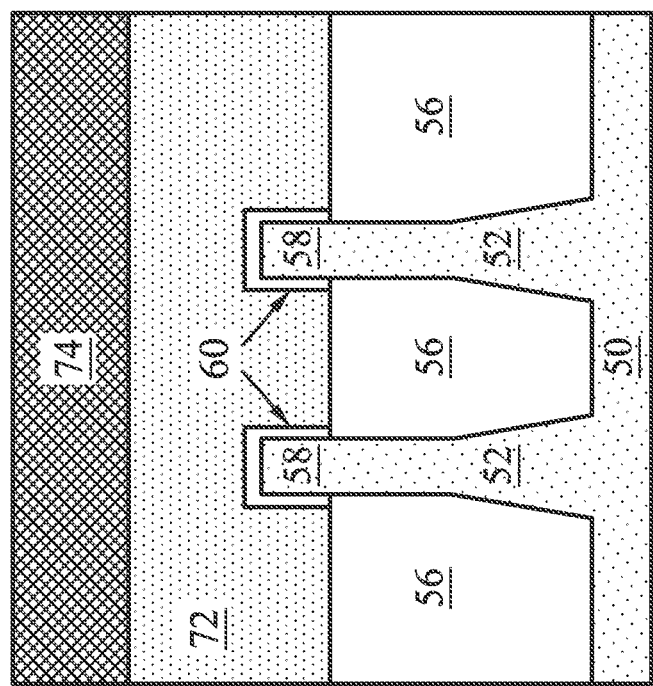
Figure 12C:
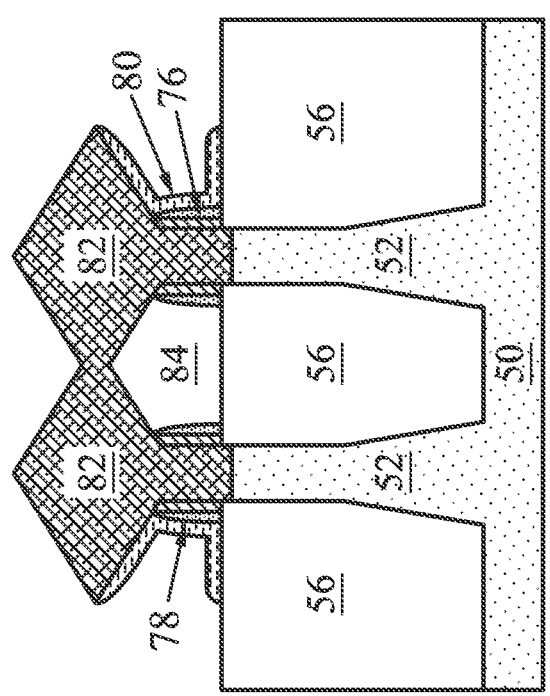

In FIGS. 12A-12C, a second gate spacer layer is formed over the structure illustrated in FIGS. 11A-11C. The second gate spacer layer may be formed by CVD or a CVD-like deposition. The second gate spacer layer may comprise one or more layers. In some embodiments, the second gate spacer layer may be formed of a low-k material. For example, the second gate spacer layer may be formed of one or more layers of low-k silicon nitride (SiN) having a k-value of between about 3.5 and about 4. In some embodiments, the second gate spacer layer may further include carbon (C), oxygen (O), combinations thereof, or the like in order to decrease the k-value of the second gate spacer layer.

The second gate spacer layer may be deposited using a low-temperature process. For example, the process temperature may be between about 50° C. and about 200° C. In some embodiments, an anneal process may be performed following the deposition of the second gate spacer layer. The anneal process may be performed at a temperature between about 600° C. and about 800° C. and the anneal process may continue for between about 2 hours and about 4 hours.

According to some embodiments, the second gate spacer layer may comprise SiOCN having a composition of about 33.4 percent by mass Si, 4.6 percent by mass O, 42.6 percent by mass C, and 19.5 percent by mass N. This material may be referred to as KN1. The second gate spacer layer is deposited using precursors including hexachlorodisilane ($Si_2Cl_6$, HCD), propylene ($C_3H_6$), oxygen ($O_2$), and ammonia ($NH_3$). The second gate spacer layer is deposited at a process temperature of about 630° C. and the resulting second gate spacer layer has a density of about 2.467 g/cm$^3$ and a k-value of about 5.0.

According to some embodiments, the second gate spacer layer may comprise SiOCN having a composition of about 29.8 percent by mass Si, 7.2 percent by mass O, 46.5 percent by mass C, and 16.4 percent by mass N. This material may be referred to as RP1. The second gate spacer layer is deposited using precursors including HCD, RENA (($C_2H_5$)$_3$N, also referred to as triethylamine), $NH_3$, and $O_2$. The second gate spacer layer is deposited at a process temperature of about 630° C. and the resulting second gate spacer layer has a density of about 2.397 g/cm$^3$ and a k-value of between about 4.2 and about 4.3.

According to some embodiments, the second gate spacer layer may comprise SiOCN having a composition of about 28.1 percent by mass Si, 2.0 percent by mass O, 62.2 percent by mass C, and 7.7 percent by mass N. This material may be referred to as RP2 CIP. The second gate spacer layer is deposited using precursors including HCD, RENA, and $O_2$. The second gate spacer layer is deposited at a process temperature of about 630° C. followed by an anneal at about 700° C., and the resulting second gate spacer layer may have a density of about 2.3 g/cm$^3$ and a k-value of about 4.1.

According to some embodiments, the second gate spacer layer may comprise SiOCN having a composition of about 28.1 percent by mass Si, 11.2 percent by mass O, 60.1 percent by mass C, and 0.6 percent by mass N. This material may be referred to as HA3 CIP. The second gate spacer layer is deposited using precursors including calypso and water ($H_2O$) along with pyridine ($C_5H_5N$) as a catalyst. The second gate spacer layer is deposited in a low pressure, low temperature (LPLT) process. The second gate spacer layer is deposited at a process temperature of about 80° C. followed by an anneal at about 570° C., and the resulting second gate spacer layer may have a density of about 2.05 g/cm$^3$ and a k-value of about 3.8.

According to some embodiments, the second gate spacer layer may comprise SiOCN having a composition of about 26.4 percent by mass Si, 14.6 percent by mass O, 58.2 percent by mass C, and 0.8 percent by mass N. This material may be referred to as HN2 CIP. The second gate spacer layer is deposited using precursors including calypso and water ($H_2O$) along with pyridine ($C_5H_5N$) as a catalyst. The second gate spacer layer is deposited in an LPLT process. The second gate spacer layer is deposited at a process temperature of about 80° C. followed by an anneal at about 570° C., and the resulting second gate spacer layer may have a density of about 1.77 g/cm$^3$ and a k-value of about 3.6.

In some embodiments, the second gate spacer layer is formed of a material having a low step coverage. For example, the step coverage of the second gate spacer layer may be expressed as the ratio of the thickness of the second gate spacer layer formed on sidewalls of the first gate spacers 76 to the thickness of the second gate spacer layer formed on top surfaces of the epitaxial source/drain regions 82. The gate spacer layer may have a step coverage of less than 70 percent. In embodiments in which the gate spacer layer comprises a material having the low step coverage, a space may remain unfilled by the gate spacer layer below the gate spacer layer and between the first gate spacers 76 and the epitaxial source/drain regions 82, as illustrated in FIG. 12B. According to an embodiment, this recess may be filled with a gas before the second gate spacer layer is deposited such that gaseous spacers 84 are formed between the first gate spacers 76 and the epitaxial source/drain regions 82. The gaseous spacers 84 may also be formed over STI regions 56 and between source/drain regions 82, as illustrated in FIG. 12C.

The second gate spacer layer is deposited over the structure of FIGS. 11A-11C in a reaction chamber. The gaseous spacers 84 may comprise any gas present in the reaction chamber when the second gate spacer layer is deposited. According to an embodiment, the gaseous spacers 84 may comprise air. In some embodiments, the gaseous spacers 84 may comprise nitrogen ($N_2$), argon (Ar), xenon (Xe), ammonia ($NH_3$), chlorine ($Cl_2$), combinations thereof, or the like. In some embodiments, the gaseous spacers 84 may further comprise precursor gases used to form the second gate spacer layer, including HCD, propylene, oxygen, ammonia, RENA, calypso, water, combinations thereof, or the like. The gaseous spacers 84 may have a k value of 0 or very close to 0.

The gaseous spacers 84 may have a width W3 of between about 1 nm and about 7 nm, such as about 2 nm. The gaseous spacers 84 may also have a height H1 (also referred to as a thickness) of between about 2 nm and about 10 nm, such as about 7 nm. The bottom surfaces of the second gate spacers 80 may define top boundaries of the gaseous spacers 84, side surfaces of the epitaxial source/drain regions 82 may define first side boundaries of the gaseous spacers 84, sidewalls of the first gate spacers 76 may define second side boundaries of the gaseous spacers 84, and portions of top surfaces of the first gate spacers 76 may define bottom boundaries of the gaseous spacers 84. The top boundaries, first side boundaries, second side boundaries, and bottom boundaries of the gaseous spacers 84 may be linear or curved. For example, in some embodiments, the top boundaries of the gaseous spacers 84 may be convex or concave. In embodiments in which a portion of the dummy gate spacers 78 remains after the dummy gate spacers 78 are etched, the first side boundaries, the second side boundaries, and the bottom boundaries of the gaseous spacers 84 may be polygonal or partially rounded.

The second gate spacer layer may be conformally deposited over the structure of FIGS. 11A-11C, and then anisotropically etched to form the second gate spacers 80. Following the anisotropic etch of the second gate spacer layer, the second gate spacers 80 are disposed along sidewalls of the first gate spacers 76, as illustrated in FIG. 12B. As illustrated in FIG. 12C, the second gate spacers 80 are disposed along surfaces of the epitaxial source/drain regions 82, the dummy gate spacers 78 and/or the first gate spacers 76, and the STI regions 56. The thickness and the shape of the second gate spacers 80 remaining after the anisotropic etch may depend on the thickness of the second gate spacer layer and the step coverage of the second gate spacer layer. Moreover, in some embodiments, additional gaseous spacers may be formed between the second gate spacers 80 and the epitaxial source/drain regions 82, the dummy gate spacers 78 and/or the first gate spacers 76, and the STI regions 56 (not separately illustrated). FIG. 12C further illustrates that the gaseous spacers 84 may be disposed between adjacent epitaxial source/drain regions 82 which are merged.

In some embodiments, the second gate spacers 80 extend at least partially over the epitaxial source/drain regions 82. The bottom surfaces of the second gate spacers 80 may be co-planar with top surfaces of the epitaxial source/drain regions 82, or the bottom surfaces of the second gate spacers 80 may be disposed above or below the top surfaces of the epitaxial source/drain regions 82. The bottom surfaces of the second gate spacers 80 may be convex, concave, or planar.

Air has an ultra-low k-value of close to 0. As such, forming the gaseous spacers 84 in the structure of 12A-12C reduces the overall effective k-value of the spacers used in the structure of 12A-12C. In some embodiments, the gaseous spacers 84 may lower the parasitic resistance of a device manufactured according to the present application. According to various aspects of the present application, the N/P channel resistance can be reduced to less than about $2.0 \times 10^3$ ohm. The speed of a device mode change may be determined by the electron swift speed of a device. Inclusion of the gaseous spacers 84 in a device may result in high electron speed, device speed increases, and increases in device mode changes in the alternating current (AC) mode. Moreover, the use of the silicon-rich dummy gate spacers 78 during the epitaxial growth process of epitaxial source/drain regions 82 results in a better environment for epitaxial growth and better epitaxial growth of the epitaxial source/drain regions 82.

Figure 13B:
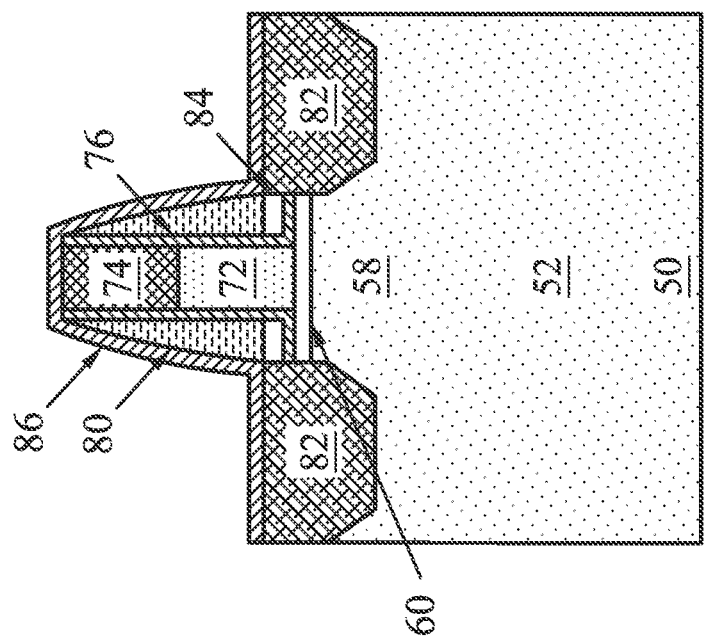
Figure 13A:
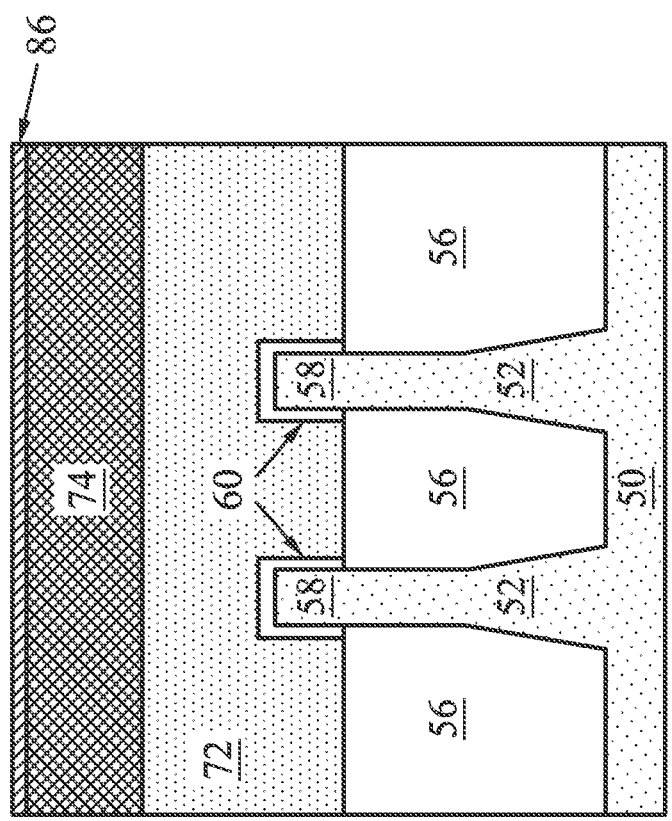
Figure 13C:
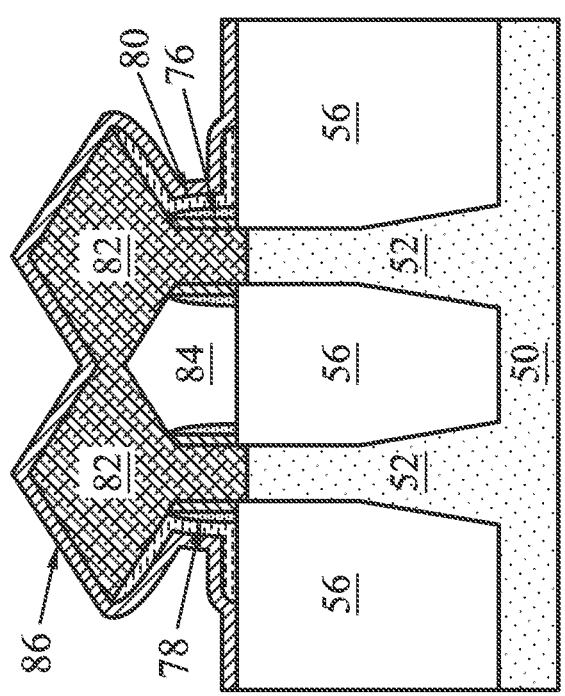

In FIGS. 13A-13C, a contact etch stop layer (CESL) 86 is formed over the structure illustrated in FIGS. 12A-12C. In accordance with some embodiments, the CESL 86 is formed of silicon nitride, silicon carbide, or another dielectric material. For example, the CESL 86 may be formed of silicon nitride having the formula $Si_3N_4$. As illustrated in FIGS. 13B and 13C, the CESL 86 may be formed over the second gate spacers 80 such that the gaseous spacers 84 remain unfilled or filled with air.

Figure 14B:
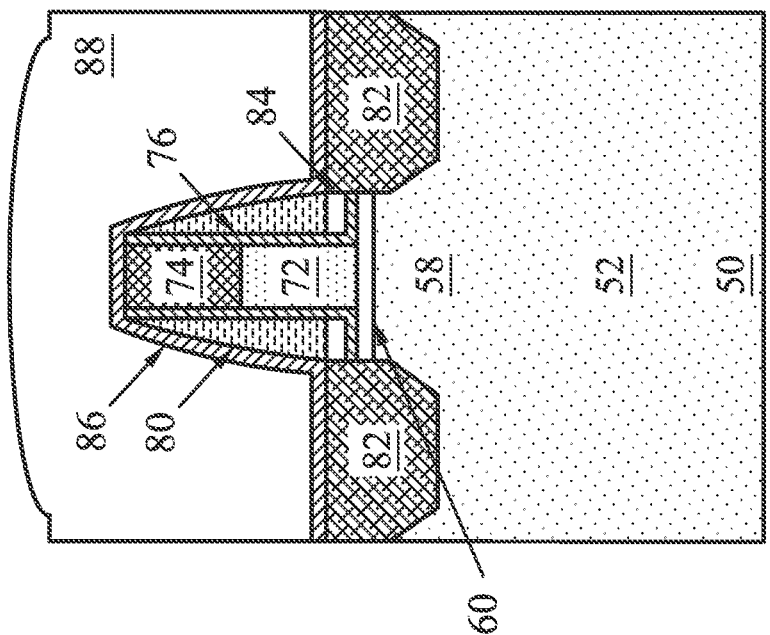
Figure 14A:
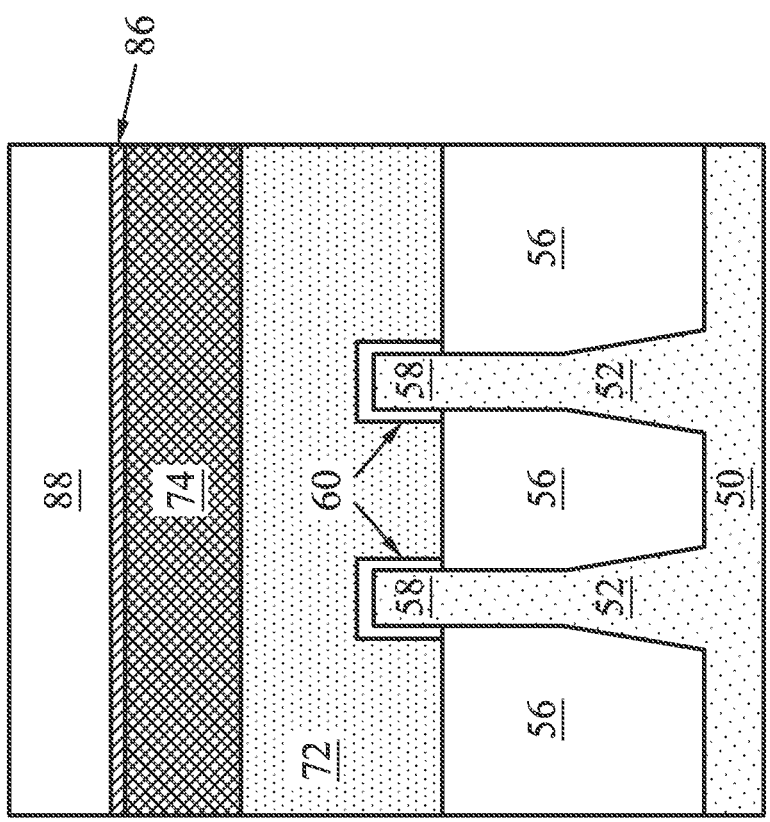
Figure 14C:
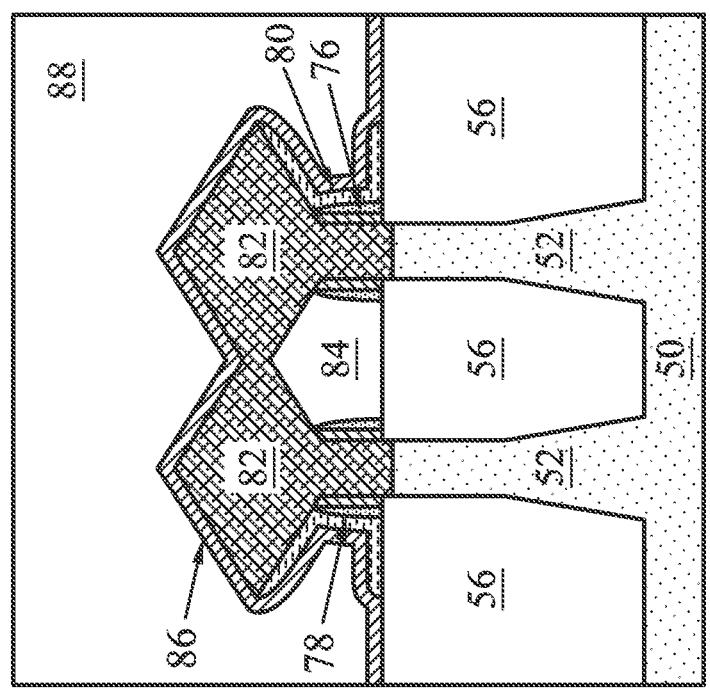

In FIGS. 14A-14C, an inter-layer dielectric (ILD) 88 is deposited over the structure illustrated in FIGS. 13A-13C. The ILD 88 may be formed of a dielectric material and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. However, other insulation materials formed by any acceptable process may also be used.

Figure 15B:
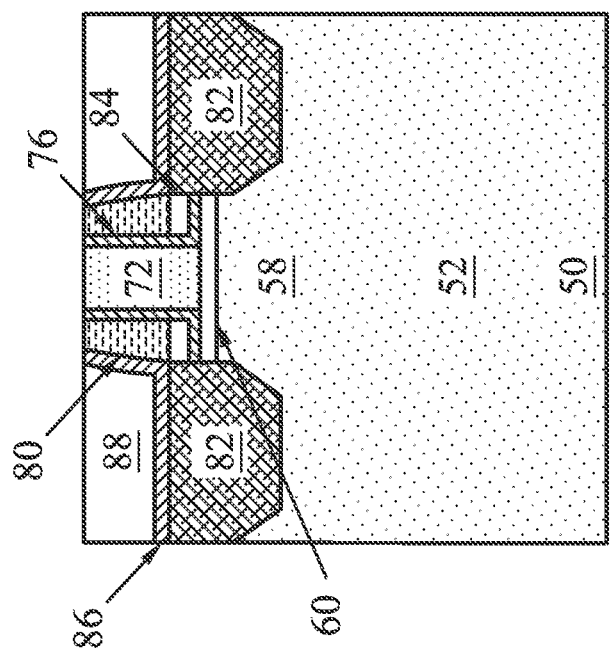
Figure 15A:
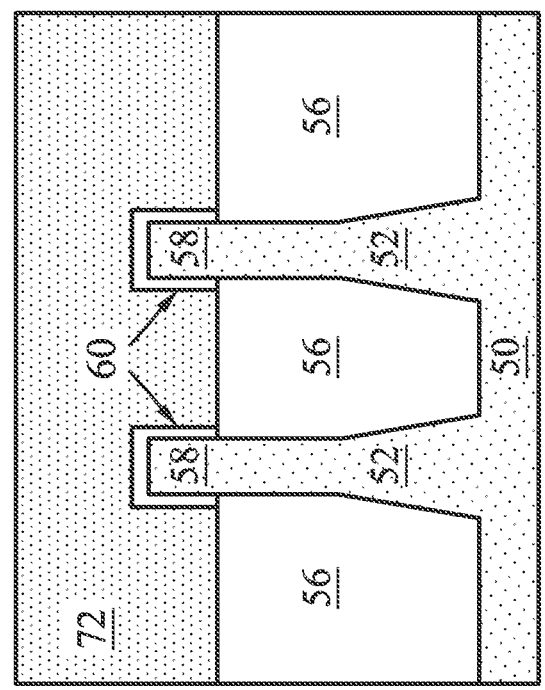

In FIGS. 15A and 15B, a planarization process, such as a CMP, may be performed to level the top surface of the ILD 88 with the top surfaces of the dummy gate electrodes 72. The planarization process may also remove portions of the CESL 86 over the dummy gate electrodes 72, the masks 74, portions of the first gate spacers 76, and portions of the second gate spacers 80. After the planarization process, top surfaces of the dummy gate electrodes 72, the first gate spacers 76, the second gate spacers 80, and the ILD 88 are level. Accordingly, the top surfaces of the dummy gate electrodes 72 are exposed through the ILD 88.

Figure 16B:
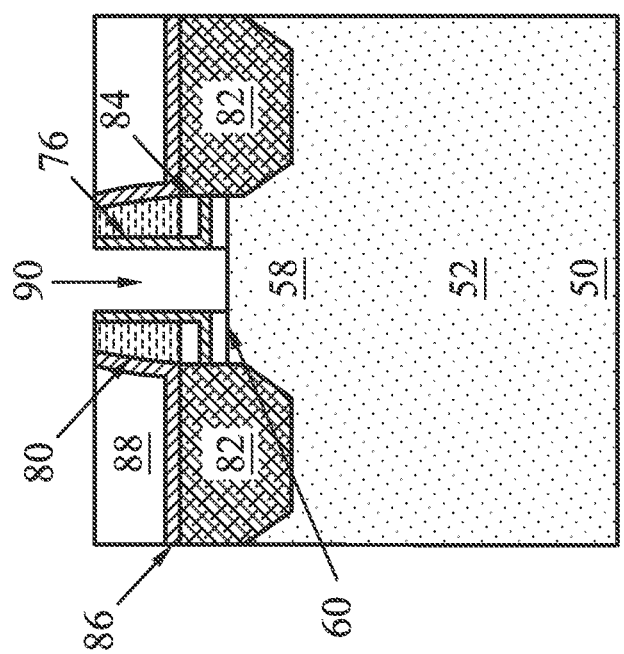
Figure 16A:
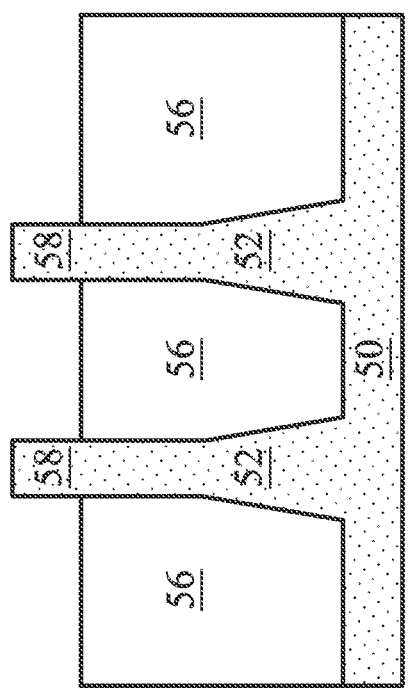

In FIGS. 16A and 16B, the dummy gate electrodes 72 and portions of the dummy dielectric layer 60 directly underlying the exposed dummy gate electrodes 72 are removed in an etching step(s), so that recesses 90 are formed. In some embodiments, the dummy gate electrodes 72 are removed by an anisotropic dry etch process. For example, the etching process may include a dry etch process using reaction gas(es) that selectively etch the dummy gate electrodes 72 without etching the ILD 88 or the first gate spacers 76. Each recess 90 exposes a channel region of a respective fin 58. Each channel region is disposed between neighboring pairs of the epitaxial source/drain regions 82. During the removal, the dummy dielectric layer 60 may be used as an etch stop layer when the dummy gate electrodes 72 are etched. The dummy dielectric layer 60 may then be removed after the removal of the dummy gate electrodes 72.

In FIGS. 17A and 17B, gate dielectric layers 92 and gate electrodes 94 are formed for replacement gates. Gate dielectric layers 92 are deposited conformally in the recesses 90. For example, gate dielectric layers 92 may be deposited on the top surfaces and the sidewalls of the fins 58 and on sidewalls of the first gate spacers 76. The gate dielectric layers 92 may also be formed on top surfaces of the ILD 88, the CESL 86, and the second gate spacers 80. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, combinations thereof, or multi-layers thereof. For example, although a single gate electrode 94 is illustrated, any number of work function tuning layers may be deposited in the recesses 90. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack." The gate and the gate stacks may extend along sidewalls of a channel region of the fins 58.

The formation of the gate dielectric layers 92 in the region 50A and the region 50B may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 18B:
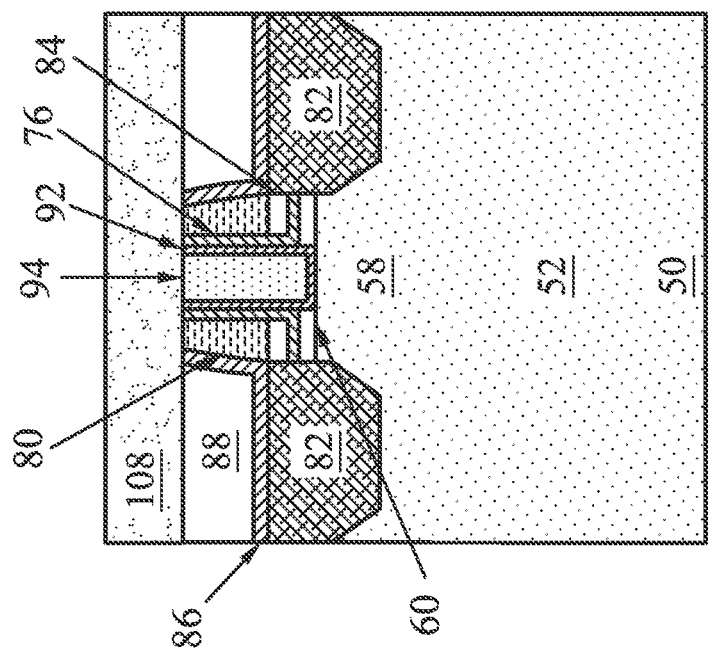
Figure 18A:
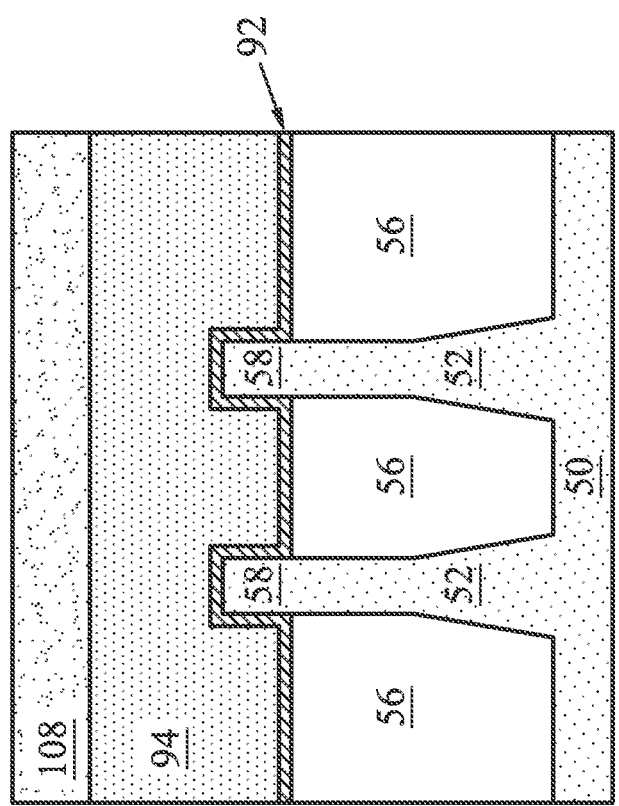

In FIGS. 18A and 18B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 19B:
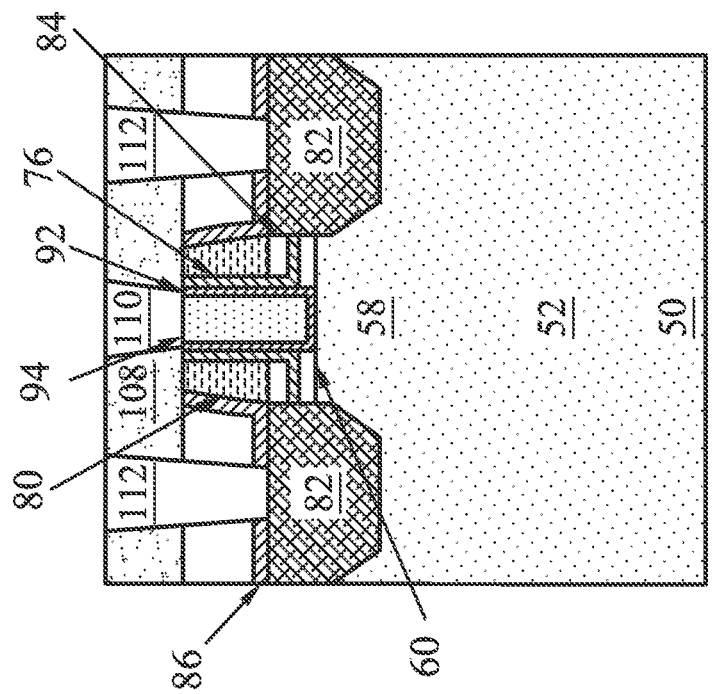
Figure 19A:
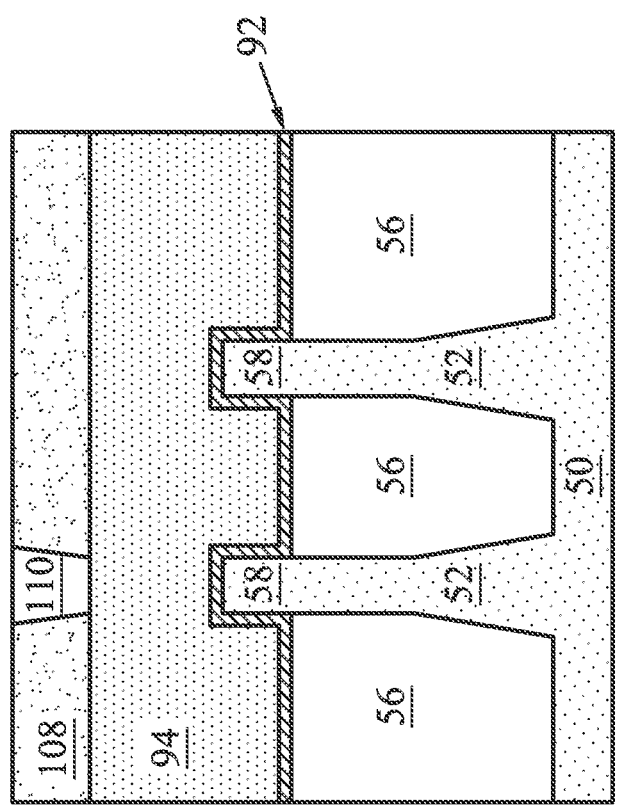

In FIGS. 19A and 19B, contacts 110 and 112 are formed through the ILD 108 and the ILD 88. In some embodiments, an anneal process may be performed to form a silicide at the interface between the epitaxial source/drain regions 82 and the contacts 112 prior to the contacts 112 being formed. The contact 110 is physically and electrically connected to the gate electrode 94, and the contacts 112 are physically and electrically connected to the epitaxial source/drain regions 82. FIGS. 19A and 19B illustrate the contacts 110 and 112 in a same cross-section; however, in other embodiments, the contacts 110 and 112 may be disposed in different cross-sections. Further, the position of contacts 110 and 112 in FIGS. 19A and 19B are merely illustrative and not intended to be limiting in any way. For example, the contact 110 may be vertically aligned with the fin 52 as illustrated or may be disposed at a different location on the gate electrode 94. Furthermore, the contacts 112 may be formed prior to, simultaneously with, or after forming the contacts 110.

In accordance with an embodiment, a method includes forming a gate stack over a substrate; depositing a first gate spacer on sidewalls of the gate stack; epitaxially growing source/drain regions on opposite sides of the gate stack; and depositing a second gate spacer over the first gate spacer to form a gaseous spacer below the second gate spacer, the gaseous spacer being disposed laterally between the source/drain regions and the gate stack. In an embodiment, the gaseous spacer has a thickness of between 2 nm and 10 nm. In an embodiment, depositing the second gate spacer includes depositing a second gate spacer material having a step coverage of less than 70 percent. In an embodiment, the gaseous spacer is disposed between the first gate spacer and the second gate spacer. In an embodiment, an upper boundary of the gaseous spacer is defined by a lower surface of the second gate spacer, the upper boundary of the gaseous spacer having a concave shape. In an embodiment, the method further includes forming a recess laterally between the source/drain regions and the gate stack, the gaseous spacer being disposed in the recess.

In accordance with another embodiment, a method includes forming a gate stack over a semiconductor substrate; forming a first gate spacer on sidewalls of the gate stack; forming a dummy gate spacer over the first gate spacer; forming epitaxial source/drain regions on opposite sides of the gate stack adjacent the first gate spacer and the dummy gate spacer; etching the dummy gate spacer to form a recess between the epitaxial source/drain regions and the gate stack; and forming a second gate spacer over the recess, wherein forming the second gate spacer forms a gas spacer in the recess. In an embodiment, the second gate spacer is formed after etching the dummy gate spacer. In an embodiment, an upper boundary of the gas spacer is defined by a bottom surface of the second gate spacer, the upper boundary of the gas spacer having a concave shape. In an embodiment, at least a portion of the upper boundary of the gas spacer is disposed below upper surfaces of the epitaxial source/drain regions. In an embodiment, at least a portion of the dummy gate spacer remains after etching the dummy gate spacer, and the portion of the dummy gate spacer partially defines a boundary of the gas spacer. In an embodiment, a first epitaxial source/drain region and a second epitaxial source/drain region are formed on the same side of the gate stack, wherein the first epitaxial source/drain region is merged with the second epitaxial source/drain region, and wherein the gas spacer extends between the first epitaxial source/drain region and the second epitaxial source/drain region. In an embodiment, the recess has a width of between 5 nm and 7 nm. In an embodiment, forming the dummy gate spacer includes depositing a dummy gate spacer layer, the dummy gate spacer layer having a thickness of between 6 nm and 7.5 nm; and etching the dummy gate spacer layer to form the dummy gate spacer.

In accordance with yet another embodiment, a semiconductor device includes a gate stack over a semiconductor substrate; a first gate spacer disposed on sidewalls of the gate stack; a second gate spacer disposed on sidewalls of the first gate spacer; an epitaxial source/drain region in the semiconductor substrate; and a gas spacer disposed below the second gate spacer. In an embodiment, the gas spacer is disposed between the epitaxial source/drain region and the gate stack. In an embodiment, the gas spacer is disposed vertically between the first gate spacer and the second gate spacer, and the gas spacer is disposed laterally between the epitaxial source/drain region and the first gate spacer. In an embodiment, the gas spacer has a thickness of between 2 nm and 10 nm. In an embodiment, the gas spacer has a width of between 5 nm and 7 nm. In an embodiment, a top boundary of the gas spacer is defined by the second gate spacer, a first side boundary of the gas spacer is defined by the epitaxial source/drain region, a second side boundary of the gas spacer opposite the first side boundary is defined by the first gate spacer, and a bottom boundary of the gas spacer is defined by the first gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a gate stack over a semiconductor substrate;
   a first gate spacer extending along a sidewall of the gate stack, the first gate spacer comprising a first material;
   a second gate spacer extending along a sidewall of the first gate spacer, the first gate spacer being disposed between the second gate spacer and the gate stack, the second gate spacer comprising a second material different from the first material;

a gas spacer disposed vertically between the first gate spacer and the second gate spacer; and a source/drain region adjacent the first gate spacer, the second gate spacer, and the gas spacer, the gas spacer physically contacting the sidewall of the first gate spacer and a sidewall of the source/drain region opposite the sidewall of the first gate spacer.

2. The semiconductor device of claim 1, wherein the gas spacer is disposed horizontally between the first gate spacer and the source/drain region.

3. The semiconductor device of claim 2, wherein the gas spacer is in physical contact with a bottom surface of the second gate spacer.

4. The semiconductor device of claim 1, wherein a top surface of the first gate spacer is level with a top surface of the second gate spacer.

5. The semiconductor device of claim 1, wherein a bottom surface of the first gate spacer is disposed below a bottom surface of the second gate spacer.

6. The semiconductor device of claim 1, wherein the gas spacer has a width from 5 nm to 7 nm.

7. The semiconductor device of claim 1, wherein the second gate spacer comprises SiOCN having a dielectric constant from 3.5 to 4.

8. A semiconductor device comprising:
a fin extending from a semiconductor substrate;
a gate stack over the fin;
a spacer structure adjacent the gate stack, the spacer structure comprising:
 a first gate spacer adjacent a sidewall of the gate stack;
 a gas spacer over the first gate spacer; and
 a second gate spacer over the gas spacer, the second gate spacer having a dielectric constant less than a dielectric constant of the first gate spacer; and
an epitaxial source/drain region in the fin adjacent the spacer structure, wherein the gas spacer contacts a sidewall of the epitaxial source/drain region, a sidewall of the first gate spacer, a bottom surface of the second gate spacer, and an upper surface of the first gate spacer, wherein the sidewall of the epitaxial source/drain region is disposed in a plane perpendicular to a major surface of the semiconductor substrate.

9. The semiconductor device of claim 8, wherein the first gate spacer and the second gate spacer comprise SiOCN having different ratios of silicon, oxygen, carbon, and nitrogen.

10. The semiconductor device of claim 8, wherein the first gate spacer has a dielectric constant of 5.0, and wherein the second gate spacer has a dielectric constant from 3.5 to 4.0.

11. The semiconductor device of claim 8, wherein the second gate spacer has a density less than a density of the first gate spacer.

12. The semiconductor device of claim 8, wherein top surfaces of the gate stack, the first gate spacer, and the second gate spacer are level.

13. The semiconductor device of claim 12, further comprising:
a contact etch stop layer over the epitaxial source/drain region and the second gate spacer; and
an interlayer dielectric layer over the contact etch stop layer, wherein top surfaces of the contact etch stop layer and the interlayer dielectric layer are level with the top surfaces of the gate stack, the first gate spacer, and the second gate spacer.

14. The semiconductor device of claim 8, further comprising a dielectric layer extending laterally from the gate stack to the epitaxial source/drain region and vertically from the fin to the first gate spacer, the dielectric layer comprising a material different from the first gate spacer and the second gate spacer.

15. A method comprising:
forming a gate stack over a semiconductor fin;
forming a first gate spacer covering a sidewall of the gate stack;
forming a second gate spacer over the first gate spacer;
forming an epitaxial source/drain region adjacent the second gate spacer;
removing the second gate spacer from over the first gate spacer, wherein the first gate spacer covers the sidewall of the gate stack after the second gate spacer is removed; and
forming a third gate spacer over the first gate spacer and the epitaxial source/drain region, wherein forming the third gate spacer forms a gas spacer below the third gate spacer and between the epitaxial source/drain region and the first gate spacer, the gas spacer contacting a sidewall of the epitaxial source/drain region opposite a sidewall of the first gate spacer.

16. The method of claim 15, further comprising replacing the gate stack with a metal gate stack after forming the third gate spacer.

17. The method of claim 16, further comprising planarizing the metal gate stack, the third gate spacer, and the first gate spacer.

18. The method of claim 15, wherein the first gate spacer comprises SiOCN, the second gate spacer comprises SiN, and the third gate spacer comprises SiOCN having a different material composition from the second gate spacer.

19. The method of claim 18, wherein the second gate spacer is removed by a wet etch process comprising phosphoric acid.

20. The method of claim 15, wherein forming the third gate spacer comprises depositing the third gate spacer using CVD at a temperature from 50° C. to 200° C.

* * * * *